United States Patent [19]
Koshiishi et al.

[11] Patent Number: 5,919,332
[45] Date of Patent: Jul. 6, 1999

[54] PLASMA PROCESSING APPARATUS

[75] Inventors: Akira Koshiishi; Masahiro Ogasawara; Keizo Hirose, all of Kofu; Kazuya Nagaseki, Yamanashi-ken; Riki Tomoyoshi, Nirasaki; Makoto Aoki, Tama, all of Japan

[73] Assignee: Tokyo Electron Limited, Tokyo, Japan

[21] Appl. No.: 08/659,387

[22] Filed: Jun. 6, 1996

[30] Foreign Application Priority Data

| Jun. 7, 1995 | [JP] | Japan | 7-166866 |
| Jun. 8, 1995 | [JP] | Japan | 7-168067 |
| Jun. 12, 1995 | [JP] | Japan | 7-169209 |
| Jun. 13, 1995 | [JP] | Japan | 7-171370 |

[51] Int. Cl.$^6$ .............. C23F 1/02; C23C 16/00
[52] U.S. Cl. ................... 156/345; 118/723 E
[58] Field of Search ............... 156/345; 118/723 E; 216/71, 67, 68

[56] References Cited

U.S. PATENT DOCUMENTS 5,529,657  6/1996  Ishii ........................ 156/345

FOREIGN PATENT DOCUMENTS 62-69620  3/1987  Japan .

Primary Examiner—Donna C. Wortman
Assistant Examiner—Brenda G. Brumback
Attorney, Agent, or Firm—Oblon, Spivak, McClelland, Maier & Neustadt, P.C.

[57] ABSTRACT

A lower insulating member 13 is arranged around a susceptor 6 as a lower electrode, and an upper insulating member 31 is arranged around an upper electrode 21. An outer end portion 31a of the upper insulating member is positioned outside an lower insulating member 13, to be lower than the upper surface of a wafer W. The narrowest distance between the lower insulating member 13 and the upper insulating member 31 is arranged to be smaller than a gap G between electrodes. Diffusion of a plasma generated between electrodes is restricted and prevented from spreading to the sides, so that inner walls of a processing container 3 are not sputtered.

15 Claims, 13 Drawing Sheets

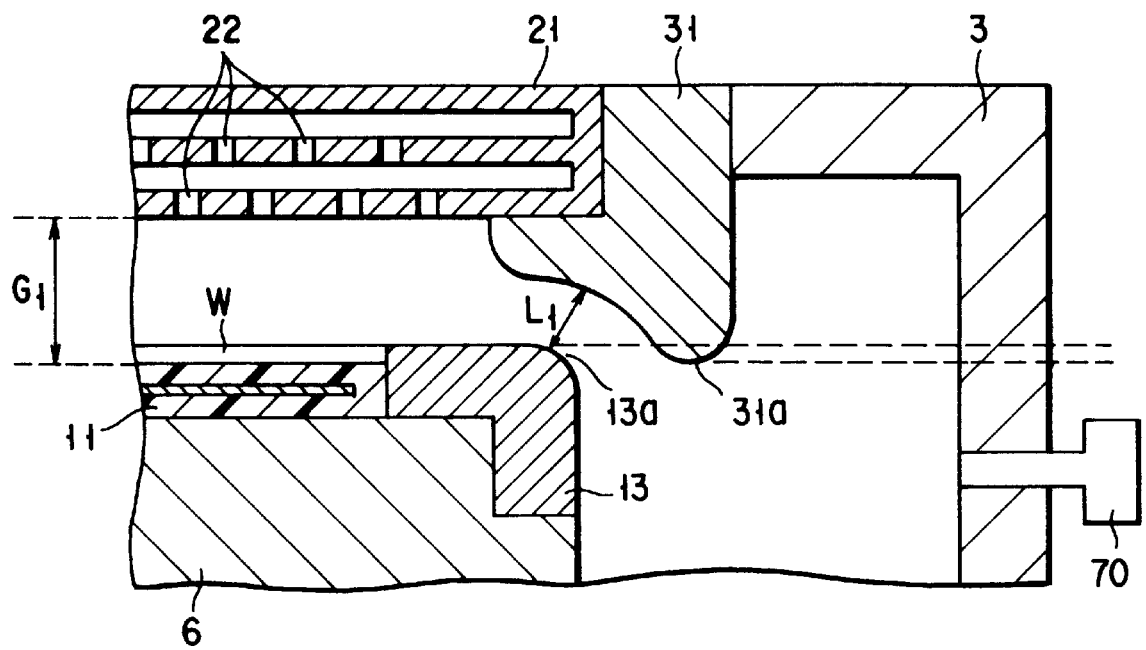
F I G. 2
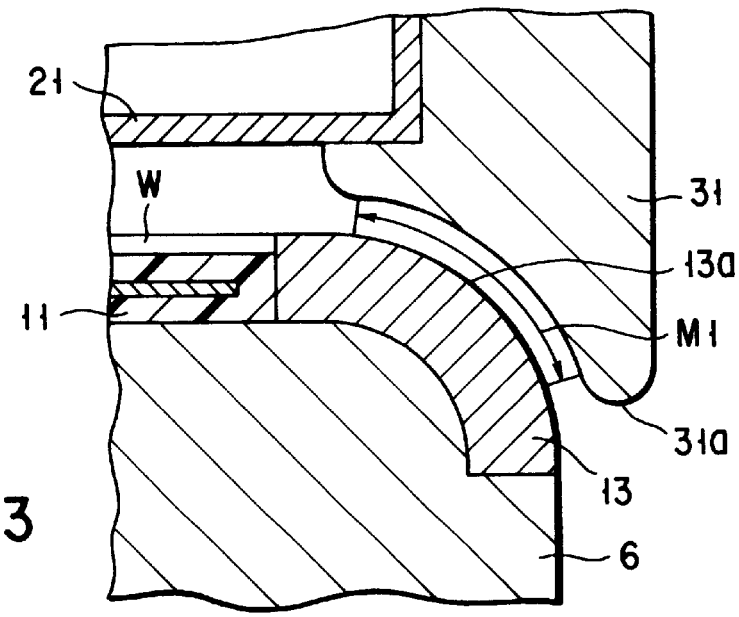
F I G. 3

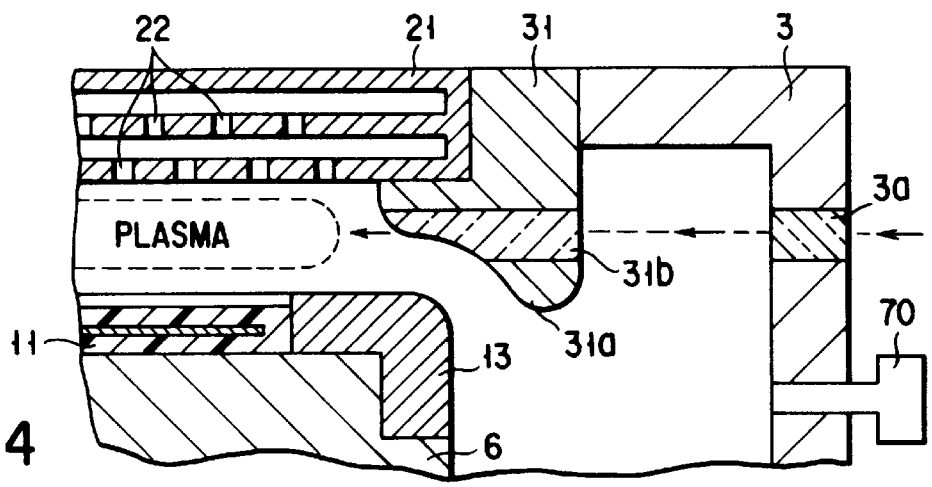
FIG. 4
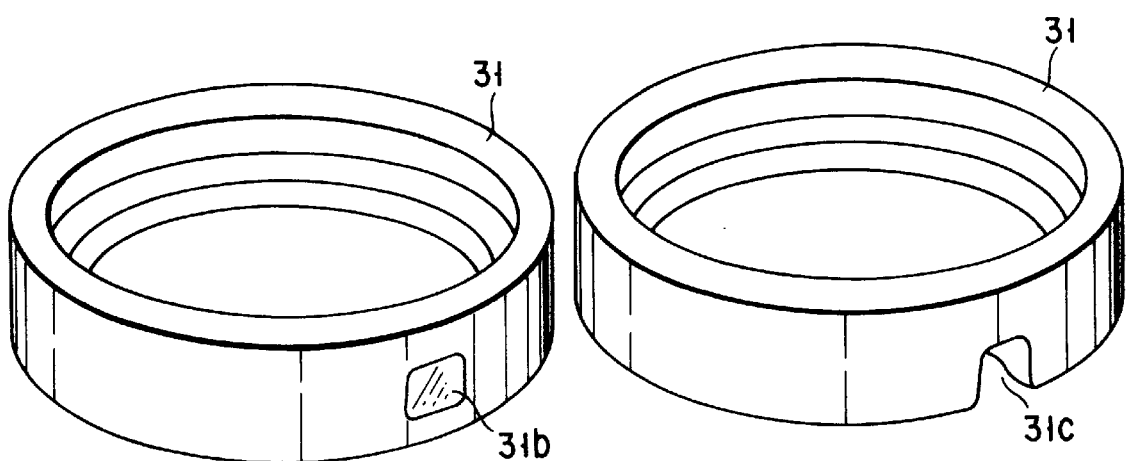
FIG. 5
FIG. 7
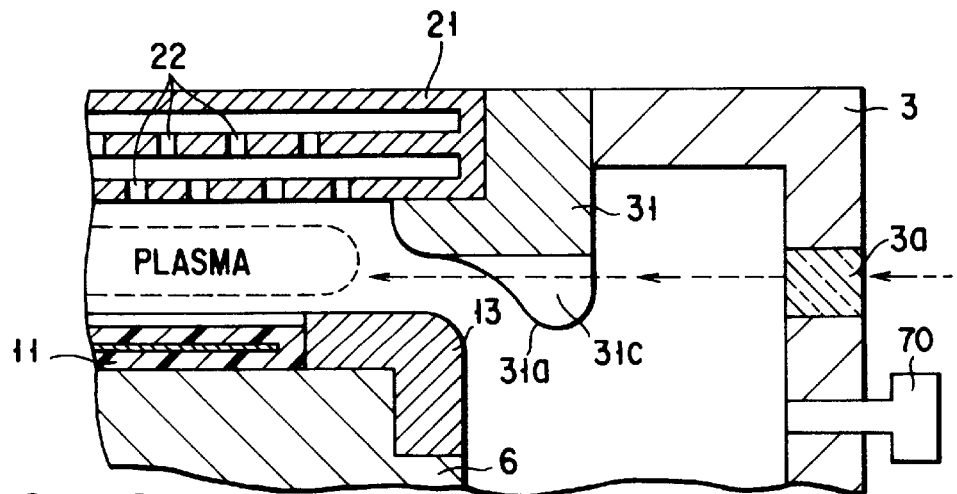
FIG. 6

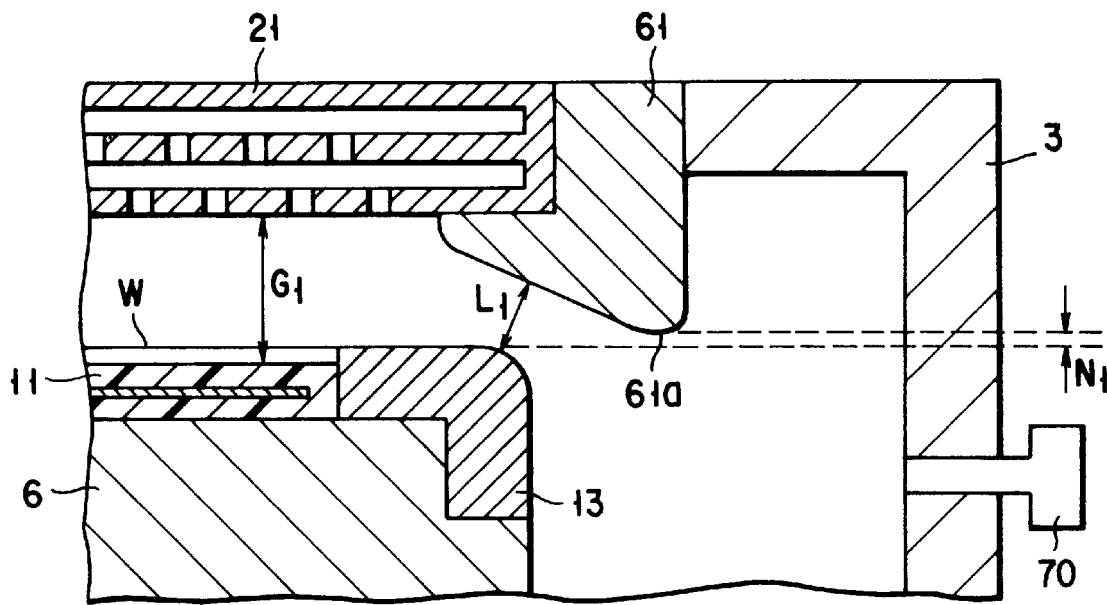
F I G. 8
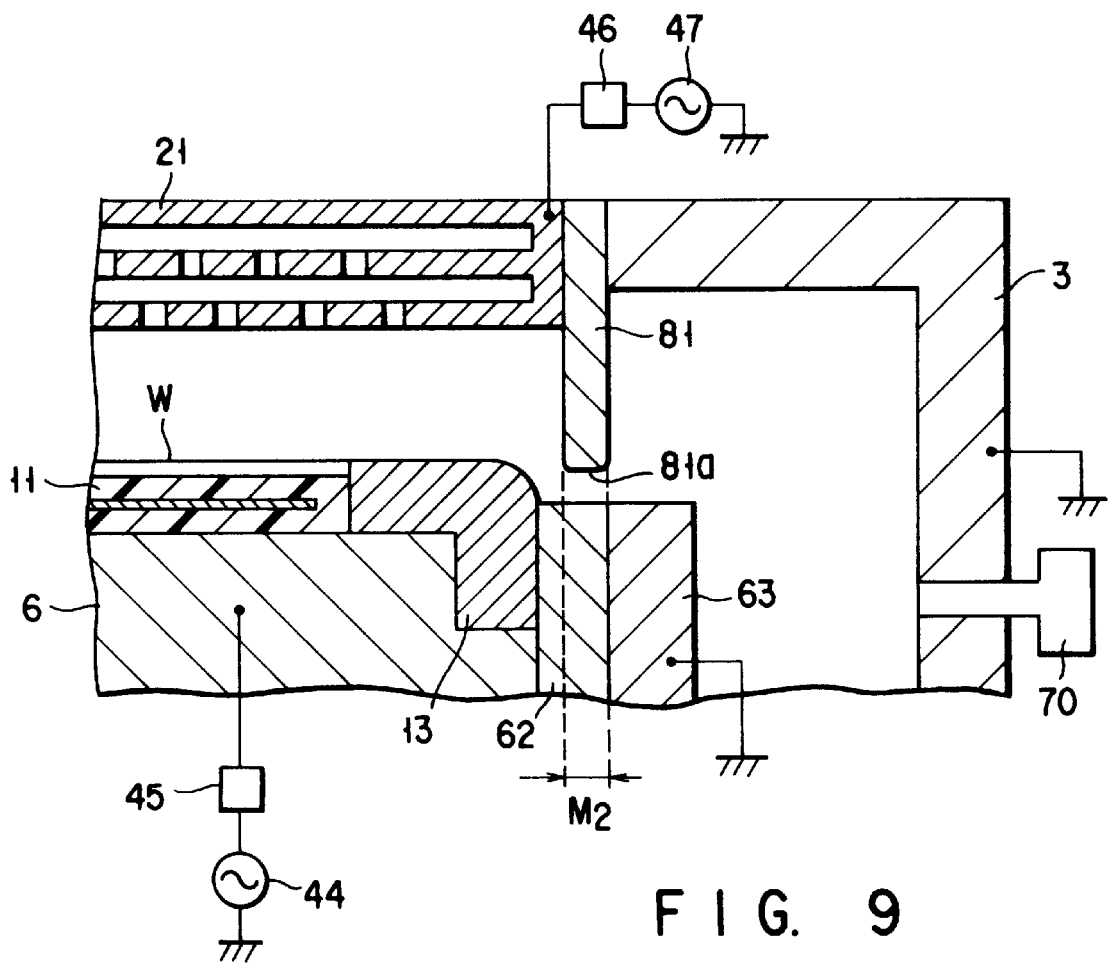
F I G. 9

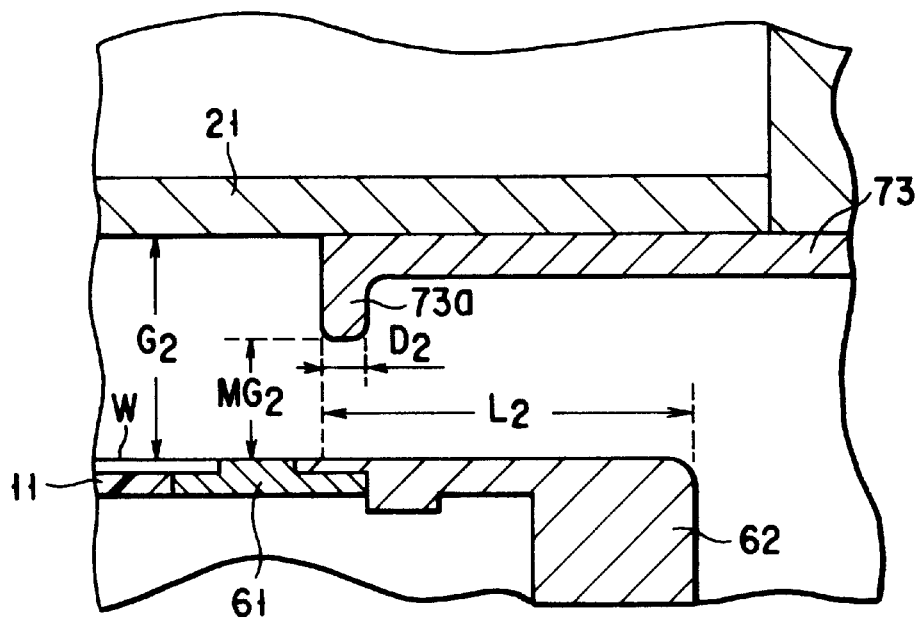
F I G. 12
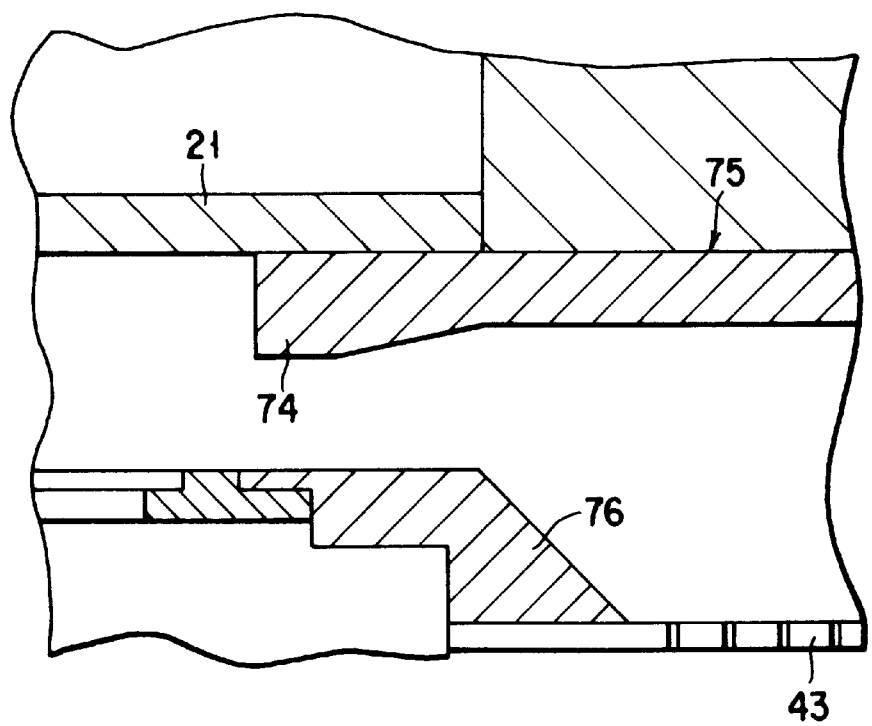
F I G. 13

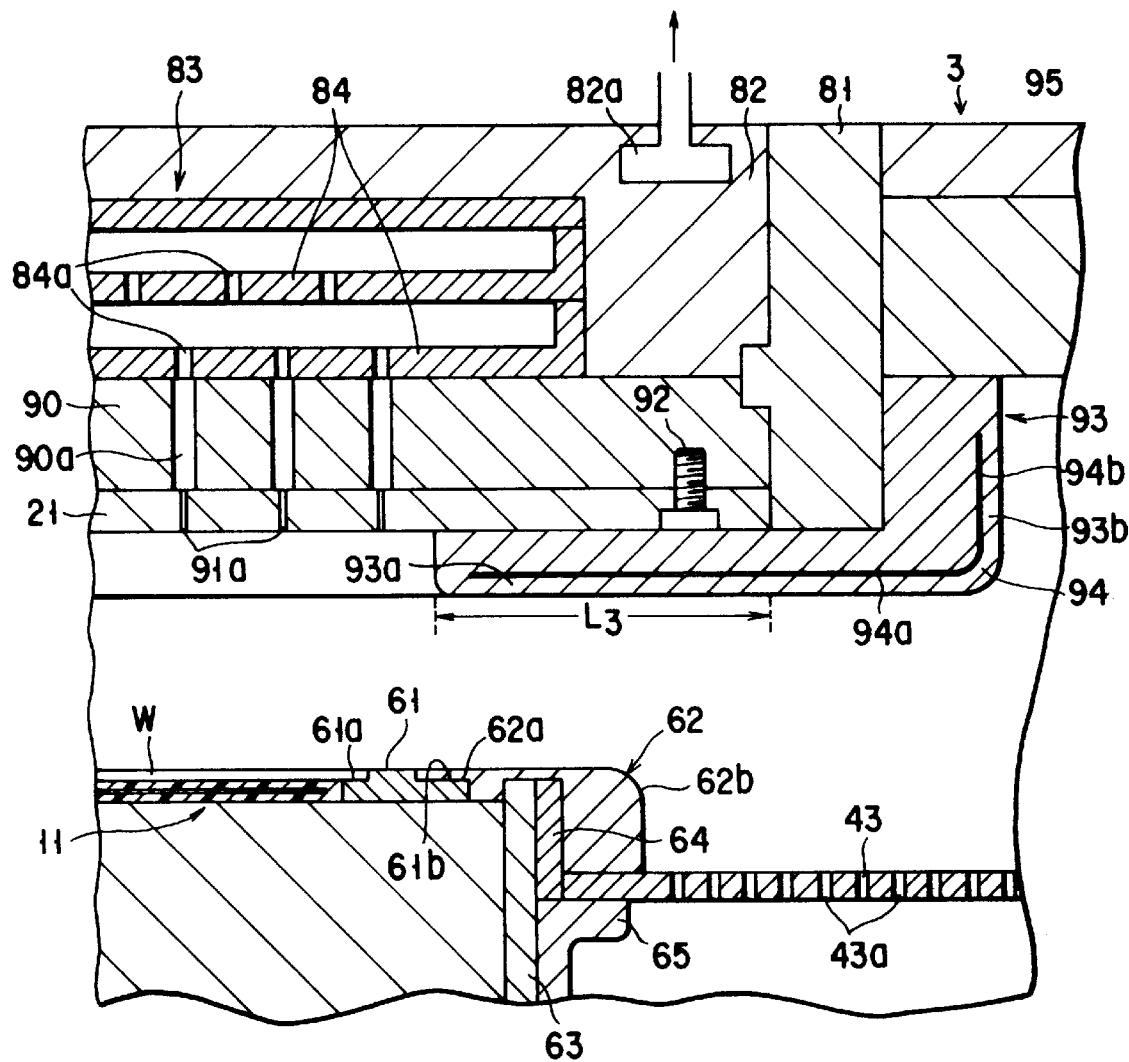
F I G. 15

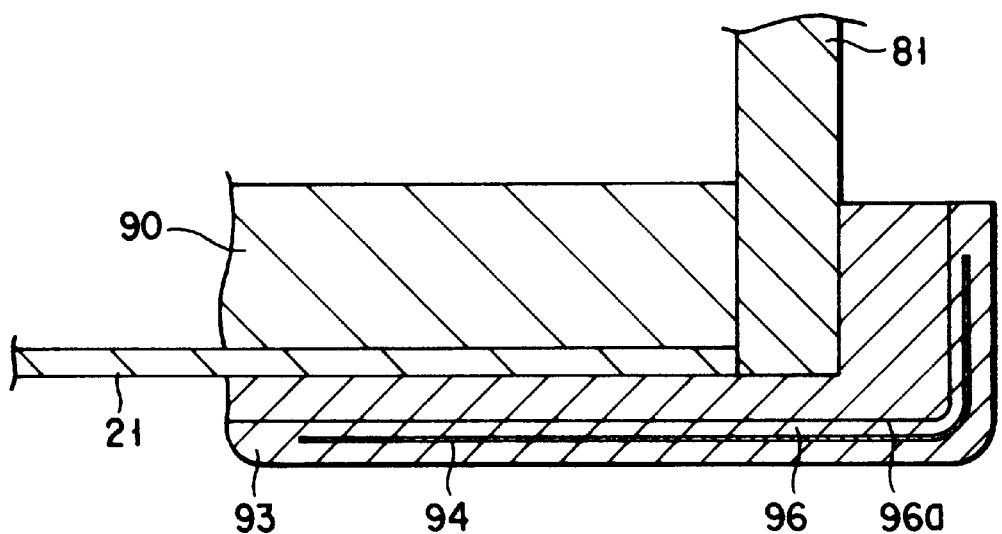
F I G. 16
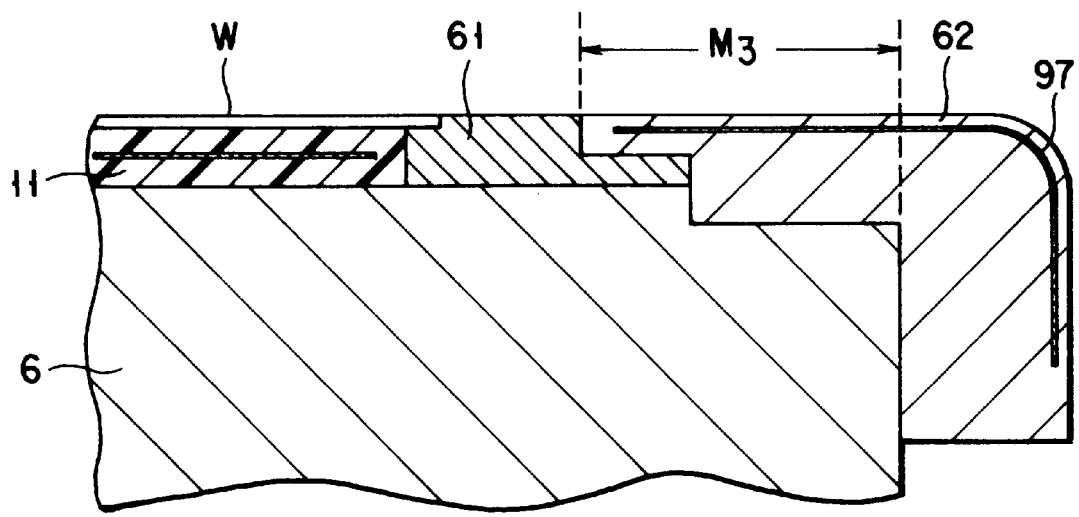
F I G. 17

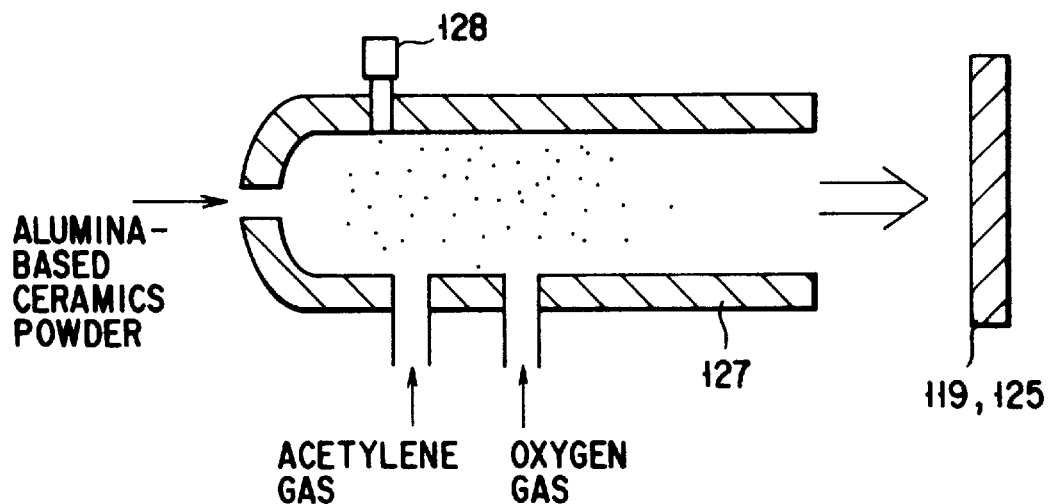
F I G. 19A
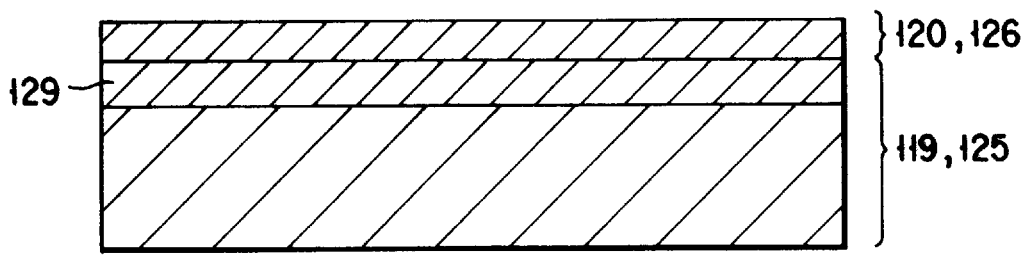
F I G. 19B

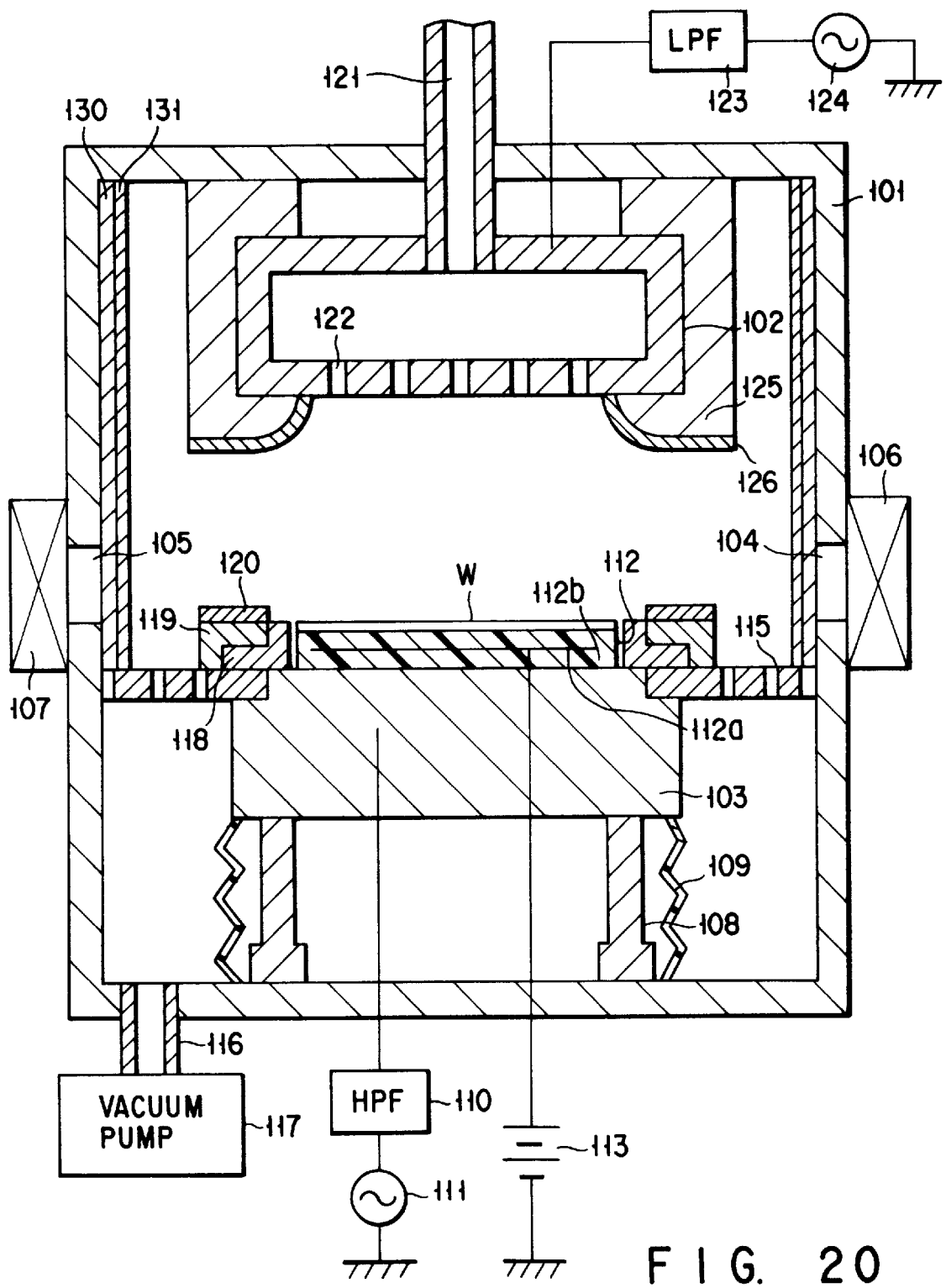
F I G. 20

PLASMA PROCESSING APPARATUS

BACKGROUND OF THE INVENTION

1. Field of the Invention

The present invention relates to a plasma processing apparatus for performing plasma processing on a substrate to be processed, such as a semiconductor wafer.

2. Description of the Related Art

Conventionally, in a semiconductor manufacturing process, etching apparatus are used to form a contact hole in an insulating film formed in a surface of, for example, a semiconductor wafer (which will be referred to as only a wafer). Among those apparatuses, an etching apparatus of a parallel plate type in which a pair of electrodes are provided in a processing chamber is particularly excellent in processing uniformity and has advantages in that the apparatus structure is relatively simple. Therefore, a large number of etching apparatuses of this type are used.

A conventional etching apparatus of the parallel plate type generally used is arranged such that a pair of plate type electrodes are provided opposite to each other in the processing chamber, for example, as well-known from Japanese Patent Application KOKAI Publication No. 62-69620. In this apparatus, a wafer as a substrate to be processed is mounted on an electrode in the lower side (i.e., a lower electrode), and an etching gas is introduced into the processing chamber. Simultaneously, a high frequency electric power is supplied to the lower electrode, thereby generating a plasma. The etching gas is dissociated thereby generating etchant ions which etch the insulating film on the wafer.

In the processing for etching this kind of insulating film, as the integration of the semiconductor device becomes higher, it is required that the processing be finer, the processing speed be more improved, and the processing be done more uniformly. Therefore, the density of a plasma generated between electrodes should be higher.

In this respect, in the plasma apparatus disclosed in Japanese Patent Application KOKAI Publication No. 62-69620, an insulating member is provided at a peripheral portion of one of the pair of electrodes, in order to prevent diffusion of a generated plasma and to concentrate the plasma between the electrodes, so that a narrow distance structure is constructed in which the distance between the insulating member and the other one of the electrodes or another insulating member is set to 70% or less of the distance between the opposing electrodes. Thus, diffusion of the area where a plasma is generated is prevented.

However, the technique disclosed in Japanese Patent Application KOKAI Publication No. 62-69620 has an object of manufacturing a DRAM of approximately 256k to 1M, and therefore does not apply to the recent aspect of manufacturing a highly integrated device, such as, a DRAM of 64M. Specifically, to practice finer etching at a higher speed, for example, the pressure in a processing chamber must be more reduced (i.e., the degree of vacuum must be increased). The prior art has been achieved by supposing a pressure (or degree of vacuum) of approximately 5 Torr to 3 Torr, and it is difficult to prevent diffusion of a plasma area at a higher degree of vacuum than that pressure, so that the etching rate cannot be improved. In addition, there is a possibility that a plasma diffused from between electrodes may directly cause spattering on an inner side wall of a processing chamber, thereby generating contamination. Further, in the narrow distance structure, those portions of the insulating member which are close to the narrow-distance area have a higher plasma density than that in the central portion of the electrodes, so that the processing is not uniform. Further, in the narrow-distance structure, an exhausted gas such as an etching gas or the like may remain in the processing area, so that desired processing cannot be performed.

Although, an ECR etching apparatus has been proposed as a technique suitable for manufacturing a DRAM of 64M, this technique is said to have a limitation that etching is limited to wafers of 6 inches and 8 inches at most, in view of its processing area, and therefore, this technique will not be suitable for a wafer of a large diameter in the future, e.g., a wafer of 12 inches.

Meanwhile, as for the upper electrode, there are several cases that an insulating member is provided at a peripheral portion of an upper electrode, to support the upper electrode on the inner wall of the processing chamber or to cover bolts or the likes used for supporting the upper electrode. In addition, as for the lower electrode, there is a case that a focus ring made of an insulating member is provided at a peripheral portion of the lower electrode, in order to increase the incidence efficiency.

Reaction products generated during the processing may stick to surfaces of the insulating members. If these products are left unchanged, they pollute the inner space of the processing chamber, lowering the yield and shortening the cleaning cycle, so that the working time of the apparatus may be shortened and the production efficiency may be lowered. Therefore, it is necessary to prevent reaction products from sticking thereto and to remove reaction products, by using any means.

Reaction products of this kind which are generally known have a poor tendency to stick or tend to be easily removed if once have stuck when the temperature is high. Therefore, in conventional cases, a heater which generates heat by electric conductance is installed on the surface or the back surface of a portion to which reaction products easily stick and the temperature of the portion is increased, thereby to prevent reaction products from sticking thereto.

However, if a heater of such a electric conductance type is installed, high frequency noise may be induced in the electric conductive path, or a magnetic field may be generated by a current flowing through the electric conductance path of the heater. Therefore, the plasma in the processing chamber may be disordered, thereby causing problems when performing predetermined etching processing. Further, installation of an optional heater complicates routing of electric conductance paths and results in increases in costs.

SUMMARY OF THE INVENTION

The present invention has a first object of providing a plasma processing apparatus in which a generated plasma is efficiently enclosed between electrodes, thereby to enable processing at a high processing rate with use of a plasma of a high density, without causing contamination.

The present invention has a second object of providing a plasma processing apparatus which is capable of preventing reaction products from sticking to an insulating member around electrodes, without optionally providing a heater.

According to the first invention of the present invention, there is provided a plasma processing apparatus wherein upper and lower electrodes are arranged opposite to each other in a processing chamber whose pressure can be freely reduced, a plasma is generated between the upper and lower electrodes by supplying a high frequency power, and processing is performed on a substrate to be processed which is mounted on the lower electrode, characterized in that an upper insulating member is provided around the upper electrode, that an outer lower end portion of the upper insulating member is positioned outside an outer circumference of the lower electrode, the outer lower end portion of the upper insulating member is positioned to be substantially equal to or lower than an upper surface of the substrate, and that the narrowest distance between the upper insulating layer and the lower electrode is smaller than a distance between the upper and lower electrodes.

In addition, according to the first invention, there is also provided a plasma processing apparatus wherein upper and lower electrodes are arranged opposite to each other in a processing chamber whose pressure can be freely reduced, a plasma is generated between the upper and lower electrodes by supplying a high frequency power, and processing is performed on a substrate to be processed which is mounted on the lower electrode, characterized in that an upper insulating member is provided in the periphery of the upper electrode, that a first ring-like member made of semiconductor material and a second ring-like member made of insulating material and positioned on an outer circumference of the first ring-like member are provided in the periphery of the lower electrode, that the narrowest distance between a portion of the upper insulating member which is close to an inner circumference thereof and the second ring-like member is smaller than a distance between the upper and lower electrodes, that the inner circumferential edge of the upper insulating member is arranged so as to correspond to a position between inner and outer circumferential edges of the second ring-like member.

According to the second invention, there is provided a plasma processing apparatus wherein upper and lower electrodes are arranged opposite to each other in a processing chamber whose pressure can be freely reduced, a plasma is generated between the upper and lower electrodes by supplying a high frequency power, and processing is performed on a substrate to be processed which is mounted on the lower electrode, characterized in that a conductive member having a high heat conductivity is embedded inside an insulating member positioned at an peripheral portion of at least one of the upper and lower electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is an enlarged view of a main part showing a positional relationship between upper and lower insulating members in the etching apparatus shown in FIG. 1.

FIG. 3 is an enlarged view of a main part showing another form of the upper insulating member applicable to the etching apparatus shown in FIG. 1.

FIG. 4 is an enlarged view of a main part of an upper insulating member showing a structure in which a window for observation of a plasma is formed in a part of the upper insulating member of the etching apparatus shown in FIG. 1.

FIG. 5 is a perspective view of an upper insulating member shown in FIG. 4.

FIG. 6 is an enlarged view of a main part of an upper insulating member showing a structure in which a notch portion for observation of a plasma is formed in the lower surface of the upper insulating member of the etching apparatus shown in FIG. 1.

FIG. 7 is a perspective view of an upper insulating member shown in FIG. 6.

FIG. 8 is an enlarged view of a main part showing a form of an upper insulating member whose lower surface is a flat oblique form applicable to the etching apparatus shown in FIG. 1.

FIG. 9 is an enlarged view of a main part showing a form of a cylindrical upper insulating member applicable to the etching apparatus shown in FIG. 1.

FIG. 12 is a view explaining a distance relationship between the sealed ring and the outer focus ring in the etching apparatus shown in FIG. 10.

FIG. 13 is a view explaining an example of another form of a sealed ring and an outer focus ring which are applicable to the present invention.

FIG. 15 is an enlarged view of a main part close to the sealed ring of the etching apparatus shown in FIG. 14.

FIG. 16 is a view showing a condition in which a vacuum layer is provided on the back surface of a conductive member in the etching apparatus shown in FIG. 14.

FIG. 17 is a view explaining a conduction in which a conductive member is air-tightly enclosed in the inner space of the outer focus ring in the etching apparatus shown in FIG. 14.

FIG. 19A is a view explaining a method for forming a quartz member of an alumina-based ceramics layer by means of explosive elution.

FIG. 19B is a cross-section showing an alumina-based ceramics layer formed on a quartz member by means of explosive elution.

FIG. 20 is a view explaining another structure of an etching apparatus according to Embodiment 4 of the present invention.

DETAILED DESCRIPTION OF THE PREFERRED EMBODIMENTS

Figure 1:
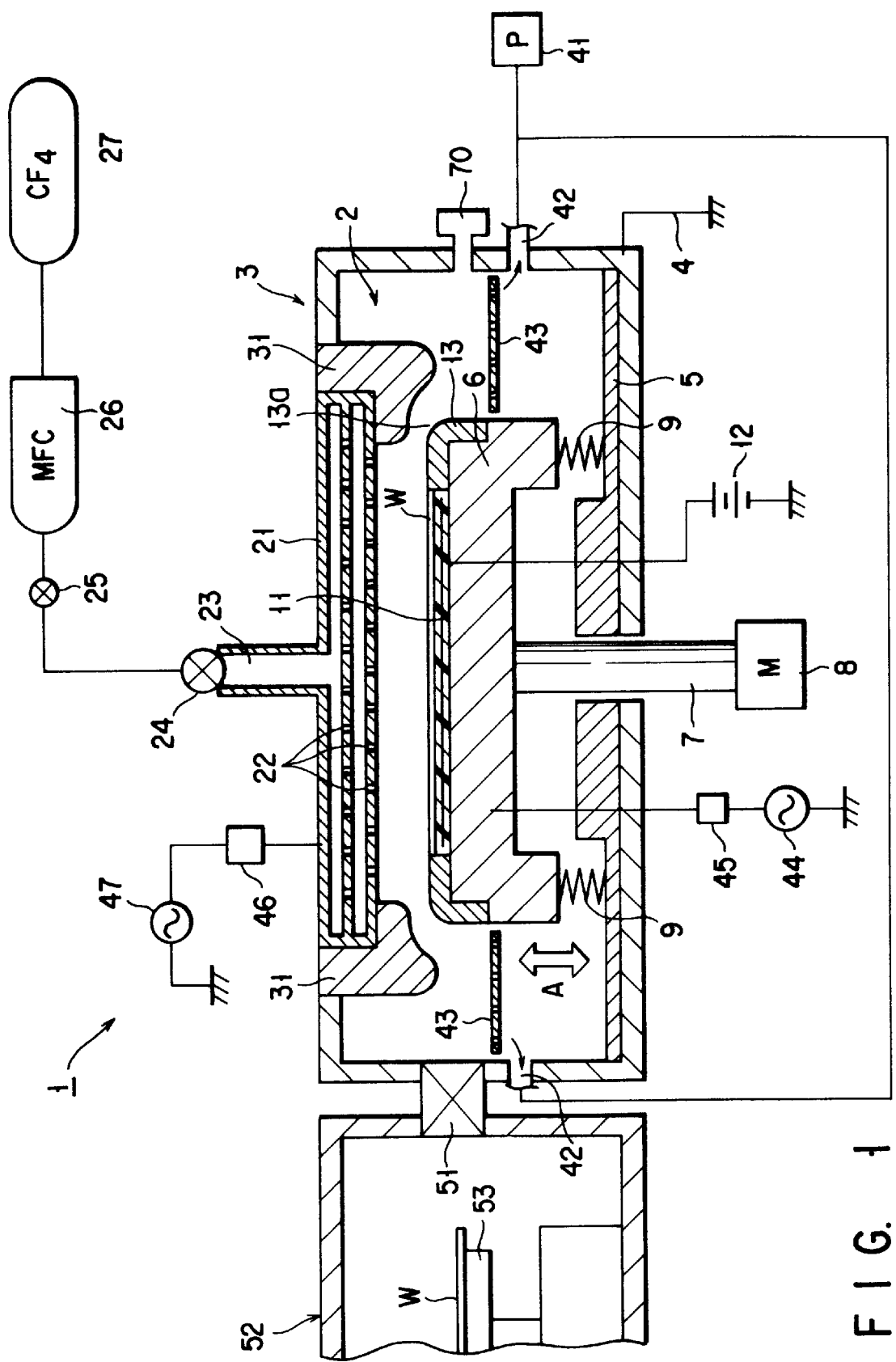
FIG. 1 is a view explaining the structure of an etching apparatus according to a first embodiment of the first invention of the present invention.

The plasma processing apparatus according to a first embodiment of the first invention is characterized in that an upper insulating member is provided around the upper electrode among upper and lower electrodes provided to be opposite to each other in the processing chamber, that an outer lower end portion of the upper insulating member is arranged to be positioned outside the outer circumference of the lower electrode, that the outer lower end portion of the upper insulating member is arranged at a position which is substantially equal to or lower than the upper surface of a processing substrate to be mounted on the lower electrode, and that the narrowest distance between the upper insulating member and the lower electrode is arranged to be narrower than the distance between the upper and lower electrodes. In this case, it is preferable that the narrowest distance between the upper insulating member and the lower electrode is about 8 mm±5 mm in the radial direction.

In the plasma processing apparatus having the structure as described above, the outer lower end portion of the upper insulating member is positioned outside the outer circumference of the lower electrode, and the outer lower end portion of the upper insulating member is positioned to be substantially equal or lower than the upper surface of the processing substrate to be processed and mounted on the lower electrode. Therefore, the upper insulating member extends into the space between the upper and lower electrodes. Since the narrowest distance between the upper insulating member and the lower electrode is set to be narrower than the gap between the upper and lower electrodes, a narrow flow path is formed and a plasma generated between the upper and lower electrodes is efficiently prevented from being diffused even in an atmosphere of a high vacuum degree, and can maintain a plasma condition at a high density. In addition, the outer lower end portion of the upper insulating member is arranged to be substantially equal to or lower than the upper surface of the processing substrate to be processed, and therefore, there is no possibility that a leakage plasma will be directly diffused into the sides and will spatter the inner side walls of the processing chamber.

In the first embodiment, it is preferable that a lower insulating member is provided around the lower electrode, that the outer lower end portion of the upper insulating member is arranged to be positioned outside the outer circumference of the lower insulating member, that the narrowest distance between the upper insulating member and the lower insulating member is narrower than the distance between the upper and lower electrodes. The narrowest distance between the upper and lower insulating members is preferably 8 mm±5 mm. Note that the lower insulating member described above may be a focus ring used for increasing the incident efficiency of ions.

In this structure, diffusion of a plasma generated between upper and lower electrodes is also restricted by the upper and lower insulating members, so that a high plasma density is achieved. In addition, the plasma is prevented from being diffused into the sides and from spattering the inner side walls of the processing chamber.

In the first embodiment, it is preferable to form a window or a notch portion for observation of a plasma, in a part of the upper insulating member. As a result of this, the plasma condition in the insulating member can be observed from outside through the window or the notch portion.

In the first embodiment, the lower surface of the upper insulating member, e.g., the surface oriented to the lower electrode and the lower insulating member is preferably formed by consecutive surfaces which do not include gaps, e.g., flat surfaces and loose curved surfaces. In addition, the upper surface of the lower insulating member is preferably formed by consecutive surfaces including no gaps. Thus, since the lower surface of the upper insulating member is formed by consecutive surfaces including no gaps, it is possible to prevent reaction products generated by a plasma, from sticking to the lower surface of the upper insulating member. In this manner, the number of times for which cleaning is performed can be reduced.

In the first embodiment, a grounded electrode may be provided around and outside of the lower electrode. In this case, a grounded electrode may be provided outside the lower insulating member, if a lower insulating member is provided. As a result of this, a stable plasma condition can be maintained.

In the first embodiment, the distance between the upper and lower electrodes is preferably set to 20 mm to 35 mm. In this setting, for example, in the etching processing, it is easier to perform fine etching with a high etching rate, on a substrate to be processed, under a reduced pressure atmosphere in which the degree of vacuum is 10 mTorr to 100 mTorr. Note that the plasma (inert gas plasma such as Ar gas plasma) density at a central portion between the electrodes is approximately $5 \times 10^{11}$ ions/cm$^3$ to $1 \times 10^{11}$ ions/cm$^3$ if the distance between the upper and lower electrodes is set to 20 mm to 35 mm.

In the first embodiment, the outer lower end portion of the upper insulating member is preferably set to be lower than a position which is higher by 5 mm than the upper surface of the substrate to be processed. In this setting, it is possible to prevent a leakage plasma from being diffused toward the side and from spattering the inner side wall of the processing chamber.

The plasma processing apparatus according to a second embodiment of the first invention is characterized in that an upper insulating member is provided in the periphey of an upper electrode among upper and lower electrodes provided to be opposite to each other in a processing chamber, that a first ring-like member made of semiconductor material and a second ring-like member made of insulating material positioned at the outer circumference of the first ring-like member are provided in the periphery of the lower electrode, that the narrowest distance between a portion of the upper insulating member which is close to the inner circumference and the second ring-like member is arranged to be narrower than the distance between the upper and lower electrodes, and that the inner circumferential edge of the upper insulating member is set to a position corresponding to a position between the inner circumferential edge and the outer circumferential edge.

According to the plasma processing apparatus having this structure, a first ring-like member is provided in the periphery of the lower electrode, and a second ring-like member made of insulating material is further provided in the periphery of the first ring-like member. The distance defined between the second ring-like member and the portion of the upper insulating member close to the inner circumference is arranged to be narrower than the distance between the upper and lower electrodes. Therefore, diffusion of a plasma generated between the upper and lower electrodes is restricted between the second ring-like member and the portion of the upper insulating member close to the inner circumference.

Ions existing in a plasma thus enclosed are efficiently injected onto a substrate to be processed, on the lower electrode. Therefore, fine etching is performed on a substrate to be processed under a plasma of a high density. In addition, the inner circumferential edge of the upper insulating member is positioned so as to corresponding to a position between the inner and outer circumferential edges of the second ring-like member, i.e., the inner circumferential edge is positioned to be higher than the second ring-like member positioned outside the first ring-like member. Therefore, functional effects of the first ring-like member are not damaged, but the density of the peripheral portion of the processing substrate is prevented from being increased in accordance with a plasma enclosure effect.

In the second embodiment, the inner circumferential edge and the outer circumferential edge of the portion forming the narrowest distance of the upper insulating member is preferably situated so as to correspond to a position between the inner and outer circumferential edges of the second ring-like member.

This structure is constructed in view of a gas conductance. Specifically, the inner and outer circumferential edges of a portion of the upper insulating member which is close to the inner circumference form a distance narrower than the distance between the upper and lower electrodes are set to correspond to a position between the inner and outer circumferential edges of the second ring-like member, i.e., above the position. Therefore, the length of the portion of the upper insulating member which is close to the inner circumference has a length (or width) in the radial direction which is shorter than the length (width) of the second ring-like member in the radial direction. Accordingly, the gas conductance when a gas is exhausted from a space (i.e., a processing space) between the upper and lower electrodes is improved, and it is therefore possible to efficiently enclose a plasma, without restricting the flow amount of a processing gas such as an etching gas or the like which is to be supplied between the upper and lower electrodes to generate a plasma.

Of course, the inner circumferential edge of the upper insulating member is positioned above the second ring-like member positioned outside the first ring-like member, and therefore, it is possible to prevent the density of the peripheral portion of the substrate to be processed from being unreasonably increased in accordance with the plasma enclosing effects, without damaging the functions and effects of the first ring-like member.

In the second embodiment, it is preferable that the outer peripheral portion of the first ring-like member and the inner peripheral portion of the second ring-like member overlap each other, that the outer circumferential edge of the upper insulating member which forms the narrowest distance of is set so as to correspond to a position between the inner and outer circumferential edges of the second ring-like member, and that the portion of the upper insulating member which forms the narrowest distance has an inner circumferential edge which is situated so as to correspond to an overlapping portion between the outer peripheral portion of the first ring-like member and the inner circumferential portion of the second ring-like member.

In this structure, although the outer peripheral portion of the first ring-like member of the semiconductor material and the inner peripheral portion of the second ring-like member overlap each other, the plasma is diluted in the overlapping portion. Therefore, since the inner circumferential edge of the portion forming the narrowest distance in the upper insulating member which constitutes the plasma enclosing means is positioned at the overlapping portion, diffusion of a plasma can be prevented at the area closer to the substrate to be processed than in the above-described case, and the plasma density in the periphery of the substrate to be processed cannot be positioned higher than the center. In addition, the portion of the upper insulating member which forms the narrowest distance has an outer circumferential edge which is positioned above the second ring-like member, so that the gas conductance is excellent.

In the second embodiment, silicon, SiC, and the like can be used as semiconductor material, while quartz, AlN, sapphire, insulating ceramics and the like can be used as insulating material.

The first and second embodiments are arranged such that an electric power of a relatively high frequency is supplied to one of the electrodes while the other of the electrodes is supplied with a electric power of a relatively low frequency. As a result, a plasma can be generated and maintained at an electric power of a high frequency. Meanwhile, the incident speed of dissociated ions into the substrate to be processed can be controlled with an electric power of a low frequency. Therefore, control of processing is facilitated.

The plasma processing apparatus according to the second invention is characterized in that a conductive member having a high heat conductivity is embedded inside an insulating member positioned at at least one of upper and lower electrodes provided so as to be In this case, a vacuum layer is preferably formed in the conductive member in the insulating member. Here, the vacuum layer means a layer which is used for vacuum heat insulation. With the vacuum layer provided on the electrode plate side, the heat is insulated by the layer. Thus, the heat is transmitted to the electrode plate side and to the opposite side, where the temperature is relatively low.

According to the plasma processing apparatus having the structure described above, when a plasma is generated in the processing chamber, ions existing in a plasma enter into the surface of an overlapping portion of the insulating member which overlaps the electrodes (where the insulating member overlaps the electrodes in the vertical direction), and the temperature of the surface therefore becomes high. In this state, since a conductive member having an excellent heat conductivity is embedded inside the insulating member, the heat of the high temperature is transmitted to the conductive member, so that the temperature of the surface of the area covered by the conductive member becomes high. Therefore, reaction products do not easily stick to the surface of this area, and the reaction products sticking thereto are removed. In view of these functions, the temperature of the surface of the insulating member can be increased if the conductive member is embedded to be as close as possible to the surface of the insulating member.

In addition, since the conductive member is air-tightly embedded in the insulating member, the conductive member is not directly exposed to a plasma even when the conductive member is made of metal material having an excellent heat conductivity, such as aluminum, poly-crystal silicon, BN (boron-nitride) or the like, or the conductive member is not spattered by a plasma, thereby polluting the inside of the processing chamber. Further, in this case, with use of a metal having a heat expansion coefficient close to that of quartz, that is, for example, a cover alloy or the like, the expansion and contraction occur in the insulation member and the transmission member in substantially an integral manner, and therefore a heat shock can be prevented. In addition, a liquid having a high heat conductivity may be enclosed in the insulating member.

In the second invention, it is preferable that a vacuum layer is formed on the back surface of a conductive member in an insulting member, i.e., the surface opposite to the opposing surfaces of the electrodes. As a result of this, the heat transmitted to the conductive member is prevented from being radiated to the side of the back surface, so that the temperature of the surface side of the insulating member (which is the side exposed to the atmosphere in the processing chamber) can be efficiently increased.

In the following, Embodiments of the plasma processing apparatus according to the present invention will be specifically explained with reference to the drawings. Note that an etching apparatus is cited as an example of the plasma processing apparatus, in the following Embodiments.

Embodiment 1

FIG. 1 is a view explaining the structure of an etching apparatus 1 according to a first embodiment of the first invention. A processing chamber 2 of this etching apparatus 1 is formed in a cylindrical processing container 3 which is made of aluminum or the like treated with alumite oxide and can be air-tightly closed. The processing container 3 itself is grounded, for example, by a grounding line 4. An insulating support plate 5 made of ceramics or the like is provided at the bottom portion of the processing chamber 2, and a substantially columnar susceptor 6 which forms a lower electrode and on which a substrate to be processed such as a wafer W having a diameter of 8 inches is mounted is provided above the insulating support plate 5.

The susceptor 6 is supported by an elevation shaft 7 penetrating through the insulating support plate 5 and the bottom portion of processing container 3, and the elevation shaft 7 is arranged such that the shaft is driven to move up and down by a drive motor 8 provided outside the processing container 3. Therefore, operation of this drive motor 8 allows the susceptor 6 to freely move up and down, as indicated by the arrow A in FIG. 1. Note that an air-tight member which can be expanded and shrank is provided so as to surround the outside the elevation shaft 7.

The susceptor 6 is made of, e.g., aluminum whose surface is oxidized. In addition, a temperature adjustment means, e.g., a heating means (not shown) such as a ceramics heater is provided inside the susceptor 6, so that the substrate to be processed can be maintained at a predetermined temperature. Usually, this temperature is automatically controlled by a temperature sensor and a temperature control mechanism (both of which are not shown).

An electrostatic chuck 11 for drawing and holding the wafer W is provided on the susceptor 6. This electrostatic chuck 11 is arranged in a structure in which, for example, a conductive thin film is clamped in a vertical direction by polyimide-based resin films. When a predetermined voltage is applied to the conductive thin film from a high voltage direct current power source 12 provided outside the processing container 3, an electric charge is generated on the surface of the polyimide-based resin film, and the wafer W is drawn and held on the upper surface of the electrostatic chuck 11 by a coulomb force induced by this electric charge. A method of holding a wafer W is not limited to the one using the electrostatic chuck 11, but it is possible to adopt a method of holding a wafer W on the susceptor 6 in a manner in which the peripheral portion of the wafer W is pressed against the susceptor 6 by a mechanical clamp.

A lower insulating member 13 made of quartz and having a substantially ring-like shape is provided so as to surround the electrostatic chuck 11, at the upper edge of the susceptor 6. The upper surface of the lower insulating member 13 is substantially the same as the surface of the wafer W, and outer circumferential edge portion 13a has a curved shape (or rounded shape) in order to prevent discharging between the circumferential edge and another portion where a potential difference occurs. In addition, the lower insulating member 13 also functions as a focus ring, thereby achieving a function of making ions in a plasma enter into the wafer W.

Above the susceptor 6, an upper electrode 21 is provided so as to oppose the susceptor 6 in parallel with each other.

The upper electrode 21 has hollow structures of a plurality of stages, as shown in FIG. 2, and the portion which is in contact with a plasma, e.g., a portion exposed to the inside of the processing chamber 2 is formed of silicon (Si) having a thickness which sufficiently allows an applied high frequency power to permeate. Material of the upper electrode 21 may be vitrified carbon or aluminum whose surface is processed with alumite. Further, a number of diffusion holes 22 are formed in a bulkhead plate in the hollow portions in the upper electrode 21 and the surface the electrode opposing the susceptor 6, in order to uniformly diffuse an introduced gas. The distance between the electrostatic chuck 11 and the lower surface of the upper electrode 21 which oppose the susceptor 6, i.e., the gap G1 shown in FIG. 2 is preferably set to 20 to 35 mm, in order to obtain a high etching rate.

In the center of the upper electrode 21, a gas introduce port 23 for introducing a processing gas or the like is provided. An etching gas, e.g., a $CF_4$ gas from the processing gas supply source 27 is uniformly supplied over the susceptor 6 in the processing chamber 2 through diffusion holes 22 from the gas introduce port 23 after being controlled to a predetermined flow amount by means of valves 24 and 25 and a mass-flow controller 26.

Further, an upper insulating member 31 having a substantially ring-like shape is provided on the circumferential portion, and serves to function as an insulation between the upper electrode 21 and the processing container 3.

The upper insulating member 31 is arranged so as to cover the outer circumferential lower edge of the upper electrode 21, as shown in FIG. 2, such that the outer lower end portion 31a thereof is positioned outside the outer circumference of the lower insulating member 13. The lower surface of the upper insulating member 31 opposes the outer circumferential edge portion 13a of the upper surface of the lower insulating member 13, and is shaped so as to have a surface curved like a concave with a radius of curvature greater than that of the upper outer circumferential edge portion 13a, with respect to the upper outer circumferential edge portion 13a of the lower insulating member 13. In this structure, a narrow gas flow path is formed between the lower surface of the upper insulating member 31 and the upper edge portion 13a of the lower insulating member 13. The narrowest distance $L_1$ of the path is set to be narrower than the gap G. Note that the distance desirably satisfy a requirement of $L_1$=8 mm±5 mm.

In addition, the outer lower end portion 31a of the upper insulating member 31 is formed in a shape curved to form a convex in the downward direction, and is positioned to be lower than the upper surface of the wafer W held on the electrostatic chuck 11, as shown FIG. 2.

Note that in the present embodiment, the lower surface of the upper insulating member 31 has a radius of curvature greater than the upper surface outer circumferential edge portion 13a of the lower insulating member 13, and is formed in a shape curved to form a concave with respect to the upper surface outer circumferential edge portion 13a of the lower insulating member 13. However, as shown in FIG. 3, the lower surface of the upper insulating member 31 and the upper surface outer circumferential portion 13a of the lower insulating member 13 may be arranged to be parallel with each other. In this case, the gas conductance of the flow path between the lower surface of the upper insulating member 31 and the lower insulating member 13 is increased so that the plasma density generated between the upper electrode 21 and the susceptor 6 can be increased more easily, thus achieving the etching rate to be improved more.

For example, an exhausting pipe 42 communicating with a vacuum suction means 41 such as a vacuum pump or the like is connected to a lower portion of the processing container 3. A baffle plate 43 is circularly provided around the susceptor 6. As a result, the inside of the processing chamber 2 can be vacuum sucked to an arbitrary degree of vacuum within a range of 10 mTorr to 100 mTorr. In addition, this baffle plate 43 is supported by a support member (not shown) made of appropriate insulating material such as quarts or the like. A pressure sensor 70 for detecting the pressure inside the processing chamber 2 is provided on the side wall of the processing container 3, and operation of the vacuum suction means 41 is controlled on the basis of a signal from a pressure sensor 70. In this structure, for example, it is possible to maintain the inside of the processing chamber 2 at a predetermined pressure value.

A system for supplying a high frequency power in the etching apparatus 1 described above is arranged such that the susceptor 6 as a lower electrode is supplied with a power through a matching device 45 from a high frequency power source 44 which outputs a high frequency power of, for example, 800 kHz without exceeding the frequency range of up to 1 MHz, in order to collect ions in a plasma. The upper electrode 21 is supplied with a power through a matching device 46 from a high frequency power source 47 for outputting a high frequency power of 1 MHz or more which is higher than that of the high frequency power source 44 and at which a plasma can be induced, e.g., a high frequency power of 27.12 MHz is supplied to the upper electrode 21.

A load lock chamber 52 is provided adjacent to the side of the processing container 3, with a gate valve 51 inserted therebetween. In the load lock chamber 52, there is provided a conveyer means 53 such as a conveyer arm or the like for conveying a wafer W as a substrate to be processed, to or from the processing chamber 2 in the processing container 3.

The main part of the etching apparatus 1 according to Embodiment 1 is constructed as described above. In the next, explanation will be made to a processing method in which etching is performed on an oxide film ($SiO_2$) of a silicon wafer W, for example. Note that the steps of the method are carried out in accordance with a predetermined program.

At first, after the pressure of a load lock chamber 52 is changed to be equal to the pressure of a processing chamber 2 or after the pressure of the load lock chamber 52 is increased to be higher than the pressure of the processing chamber 2 to a predetermined extent, the gate valve 51 is opened and a wafer W is conveyed into the processing chamber 2 by the conveyer 53. In this state, the susceptor 6 is moved down by operation of a drive motor 8 and is kept in a stand-by state for receiving a wafer W. Then, the wafer W is mounted on an electrostatic chuck 11 by the conveyer means 53. Thereafter, the conveyer means 53 is kept aside, and the gate valve 51 is closed. In addition, the susceptor 6 is moved up to a predetermined position by operation of the drive motor 8.

Subsequently, the internal pressure of the processing chamber 2 is reduced by a vacuum suction means 41, to a predetermined pressure value detected by a pressure sensor 70. Thereafter, a $CF_4$ gas is supplied from a processing gas supply source 27, and the pressure of the processing chamber 2 is set to and maintained at 10 mTorr, for example. Note that the pressure sensor 70 may be provided in a processing chamber facing a narrow flow path described later.

Thereafter, the upper electrode 21 is supplied with a high frequency power of frequency 27.12 MHz from the high frequency power source 47, and then, a plasma is generated between the upper electrode 21 and the susceptor 6. With a slight delay (about 1 second or less) from the generation of a plasma, the susceptor 6 is supplied with a high frequency power of frequency 800 kHz from the high frequency power source 44. Thus, by supplying a high frequency power for the susceptor 6 at a delayed timing, a wafer W is prevented from being damaged by an excessive voltage.

The $CF_4$ gas in the processing chamber 2 is dissociated by the generated plasma, thereby creating radial atoms of fluorine. The radical atoms of fluorine etch the silicon oxide ($SiO_2$) film on the surface of the wafer W, with their incident speed being controlled by a bias voltage (800 kHz) supplied to the susceptor 6.

In this process, the susceptor 6 forming one of the electrodes as described above is provided with a lower insulating member 13 such that the member 13 surrounds the wafer W, and an upper insulating member 31 is provided around the other upper electrode 21, so that a flow path narrower than the gap G between the electrodes is formed between both of the insulating members. Therefore, diffusion of a plasma generated between the susceptor 6 and the upper electrode 21 in an upward direction from the upper surface of the wafer W is restricted and the plasma density between the electrodes is increased. Of course, even when the internal pressure of the processing chamber 2 is a high degree of vacuum of 10 mTorr, diffusion of the plasma can be efficiently restricted. Therefore, it is possible to respond to demands for etching processing for a semiconductor device of 64M DRAM high integration. In other words, the etching rate of a high speed can be achieved under a reduced pressure. In addition, the lower insulating member 13 has a function of a focus ring, and therefore, radical ions of fluorine as etchant ions are injected into a wafer W with a high efficiency, and the etching rate of the silicon oxide ($SiO_2$) film on the surface of the wafer W is increased much more.

As has been described above, an etching apparatus according to the prior art involves a problem of spattering of an inner wall of a processing container accompanying diffusion of a plasma. However, in the etching apparatus 1 according to the present invention, the outer end portion 31a of the upper insulating member 31 is positioned outside the lower insulating member 13, below the upper surface of the wafer W. Therefore, a plasma generated between the upper electrode 21 and the susceptor 6 is prevented from being directly diffused toward inner walls of the processing container 3. Therefore, the inner walls of the processing container 3 are not spattered.

In addition, in the present embodiment, since the lower surface of the upper insulating member 31 is shaped to be a curved surface having not gaps, various reaction products are prevented from sticking to the lower surface when exhausting a gas. In this respect, prevention of pollution inside the processing chamber 2 is attempted. Therefore, the yield of the etching processing for an wafer is improved.

In the present embodiment, as for the narrowest distance $L_1$ between the lower surface of the upper insulating member 31 and the upper surface outer circumferential edge portion 13a, the greater the length in the radial direction or the length for which the lower surface opposes the upper surface outer circumferential edge portion 13a is, the greater the conductance of the narrow flow path formed between the lower surface of the upper insulating member 31 and the lower insulating member 13 is, and the more effective the plasma enclosing effect is. Therefore, the plasma density between the upper electrode 21 and the susceptor 6 is increased to be high, and the etching rate is improved. However, if conductance is too great, the pressure difference between the area between opposing electrodes in the processing chamber 2 and outer area of the upper insulating member 31 undesirably becomes great.

Thus, in view of the balance between conductance, the length in the radial direction of the narrowest distance $L_1$ between the lower surface of the upper insulating member 31 and the upper surface outer circumferential edge portion 13a of the lower insulating member is properly set to 3 mm to 20 mm, if an 8-inch wafer W is to be processed as in the present embodiment. Specifically, $M_1$ is set to 3 mm to 20 mm if explained with reference to an example shown in FIG. 3.

In addition, the plasma density in the present embodiment is $5 \times 10^{11}$ ions/cm$^3$ to $1 \times 10^{11}$ ions/cm$^3$, and thus, it has been recognized that this plasma density is improved by about 50% in comparison with a conventional apparatus.

In the next, investigation was made to a relationship between the narrowest distance $L_1$ between the lower surface of the upper insulating member 31 and the upper surface outer circumferential edge portion 13a of the lower insulating member 13 when etching is actually performed. The results of the investigation are shown in Table 1 below. Note that an etching gas is made flow a rate of $C_4F_8$/CO/Ar/$O_2$=10/30/255/6 (in units of SCCM), the power of the high frequency power source 47 is 2 kW, the inner pressure of the processing chamber 2 is 45 mTorr, and the gap $G_1$ between electrodes is 25 mm. The values of the etching rates in the following Table are average etching rates within the surface, and the values following "±" are indicated in percentages and each represent a variation range of the difference between the maximum etching rate and the minimum etching rate with respect to average value.

TABLE 1

| $L_1$ (mm) | Etching Rate (Å/min, ±(%)) |
|---|---|
| 16 | 4977 ± 6.3 |
| 8 | 5373 ± 5.4 |

As can be seen from Table 1, the etching rate of $L_1$=8 mm is higher than that of $L_1$=16 mm and shows more excellent uniformity.

In the next, the relationship between the etching rate and the gas conductance was investigated the length $M_1$ of the distance $L_1$ in the radial direction was changed with $L_1$=8 mm fixed. The results are shown in Table 2 below.

TABLE 2

| M1 (mm) | Etching Rate (Å/min, ±(%)) | Conductance (l/s) |
|---|---|---|
| 25 | 5375 ± 5.4 | 312 |
| 10 | 5433 ± 6.8 | 468 |
| 3 | 5441 ± 6.0 | 625 |

As can be seen from Table 2, the etching rate of $M_1$=3 mm is the highest, and the gas conductance of $M_1$=3 mm is the most excellent. Further, where the gap $G_1$ between electrodes is set to 15 mm, the etching rate is much more improved, to obtain a high value of 5967 (angstrom)±5.8 (%).

In addition, if the area where a plasma is in contact with the inner walls of the processing chamber 2 is reduced, interaction is reduced so that the amount of an out gas from the inner wall of the processing chamber is decreased. This effect results in that the amount of an out gas from a residual liquid of the chamber cleaning solvent and substances sticking to the chamber can be reduced, and leads to an effect that a plasma can be stabilized. To attain these countermeasures, the gap between electrodes is preferably set to 20 mm to 35 mm.

Note that the brightness or the like of a plasma is observed from outside, to detect the end point of the etching, in a conventional etching apparatus using this kind of plasma. In case where this technique is adopted in the etching apparatus 1 according to the present embodiment, a permeation window 3a or the like made of quartz is attached to the processing container 3, and a plasma between the upper electrode 21 and the susceptor 6 is observed with use of an appropriate detection sensor (not shown) provided externally. Therefore, when a conventional end point detection method is practiced, for example, a window 31b for monitoring a plasma is made of transparent quartz or the like, and the method is arranged such that the plasma can be monitored through the window 31b, as shown in FIGS. 4 and 5.

Otherwise, in place of forming a window 31b, if a notch portion 31c for monitoring a plasma is formed in the lower surface of the upper insulating member 31, as shown in FIGS. 6 and 7 and if light emission or the like from a plasma is monitored through the transparent window 3a, a conventional device for determining an end point of etching can be adopted without changes.

In the embodiment as described above, the shape of the lower surface of the upper insulating member 31 has a shape curved to form a concave with a radius of curvature greater than that of the upper surface outer circumferential edge portion 13a of the lower insulating member 13, with respect to the upper surface outer circumferential edge portion 13a of the lower insulating member 13, as described above, and the position of the outer lower end portion of the upper insulating member 31 is set to a position lower than the upper surface of the wafer W. However, the shape of the lower surface of the upper insulating member 31 is not limited to the above shape, but may be arranged in a shape shown in FIG. 8, for example.

In the example shown in FIG. 8, the lower surface of the upper insulating member 61 provided at the outer circumferential portion of the upper electrode 21 is formed to be a flat slope, and the height of the outer lower end portion 61a of the upper insulating member 61 is set to a position higher than the upper surface of the wafer W by 5 mm or less. Specifically, this example is prepared by setting $N_1$ of FIG. 8 to about 5 mm or less. In this example, also, diffusion of a plasma generated between the upper electrode 21 and the susceptor 6 can be efficiently restricted, and the inner side walls of the processing container 3 are prevented from being directly spattered by the plasma.

Note that, in this case, the outer lower end portion 61a of the upper insulating member 1 is positioned to be higher than the upper surface of the wafer W, and therefore, the end point of etching processing can be detected by forming a transparent window 3a in the side wall of the processing container 3 and by monitoring a plasma through the transparent window, as shown in FIG. 4 and the likes.

Further, as shown in FIG. 9, the upper insulating member provided at the outer circumferential portion of the upper electrode 21 may be replaced with an upper insulating member 81 having a cylindrical shape. The outer end portion 81a of the upper insulating member 81 simultaneously forms the lower surface of the upper insulating member 81, and the outer end portion 81a is positioned to be lower than the upper surface of the wafer W. In addition, it is desirable that the length of the outer end portion 81a in the radial direction, i.e., the length $M_2$ in FIG. 9 is well balanced when it is also set to 8 mm±5 mm in view of the plasma density and the tolerance range of the pressure difference with the upper insulating member 81 maintained as a boundary.

Note that in the example shown in FIG. 9, a grounded electrode 63 is provided on the outer circumference of the suscepter 6 with an appropriate insulating member 62 inserted therebetween. By providing such a grounded electrode 63, matching of a plasma generated between the upper electrode 21 and the suscepter 6 can be easily obtained, and the plasma can be more stabilized. This kind of grounded electrode is applicable to the structures of the embodiment described above, as shown in FIGS. 2 to 4, FIGS. 6, and 8.

In addition, the outer end portion 81a of the upper insulating member 81 is set to a position lower than the upper surface of the wafer W, and therefore, a window made of quartz or the like for monitoring a plasma may be formed in a part of the upper insulating member 81, or a notch portion for monitoring a plasma may be formed in the lower surface of the upper insulating member 81.

Note that in any of practical modifications described above, explanation has been made to cases in which the substrate to be processed is a semiconductor wafer, and Embodiment 1 is applicable to an apparatus structure in which, for example, an LCD substrate is a target to be processed. In addition, the practical modifications described above are each constructed as an apparatus for performing processing for etching a silicon oxide film ($SiO_2$) on the surface of a silicon semiconductor wafer. Practical modifications are not limited thereto, but Embodiment 1 is applicable to an apparatus for performing processing for etching various insulating films such as a silicon nitride (SiN) film, a TEOS oxide film, a BPSG film, and the like. Further, Embodiment 1 is applicable to other plasma processing apparatuses such as a plasma CVD apparatus for performing film formation processing, a spattering apparatus and the likes.

According to Embodiment 1, diffusion of a plasma generated between the upper and lower electrodes is efficiently restricted in an atmosphere of a high degree of vacuum, and a high plasma density can be obtained. Therefore, it is possible to perform highly fine etching processing by which a contact hole corresponding to etching of 64M DRAM, for example. In addition, generation of contaminations is restricted without spattering the inner side walls of the processing chamber, while improving the yield.

In addition, by forming a window for monitoring a plasma in a part of the upper or by forming a notch portion for monitoring a plasma in the lower surface of the upper insulating member, the condition of the plasma can be monitored from outside through the window or the notch portion, and in this manner, the end point of the etching processing can be easily detected with a high accuracy.

In addition, by forming the lower surface of the upper insulating member as a consecutive surface, reaction products are prevented from sticking thereto, and pollution inside the processing chamber can further be prevented, so that maintenance intervals can be elongated.

Further, by providing a grounded electrode around the outside of the lower electrode, a stable plasma condition can be maintained, so that the uniformity of processing can be improved and the yield can be improved.

Embodiment 2

Figure 10:
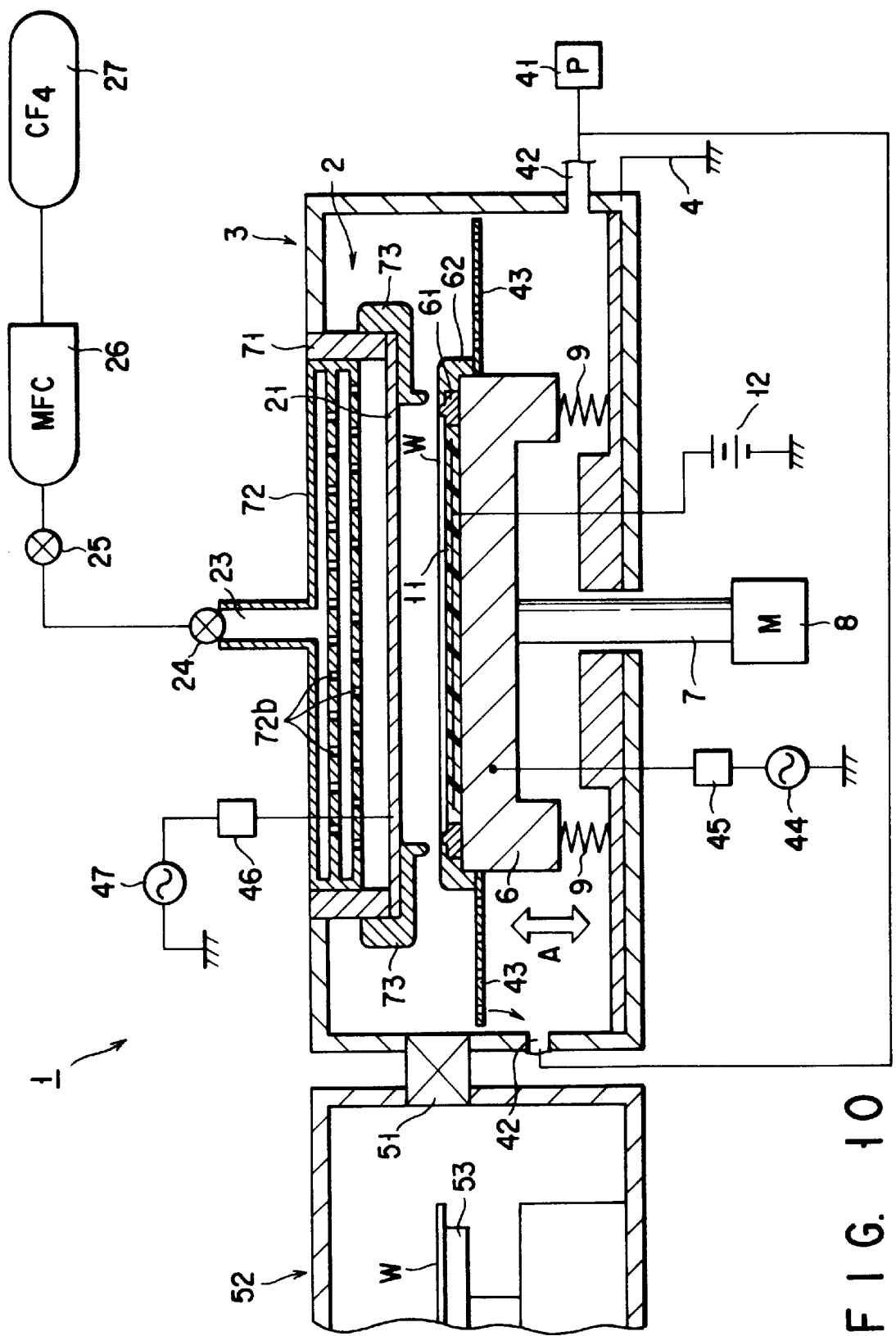
FIG. 10 is a view explaining a structure of a second embodiment of the first invention.

FIG. 10 is a view explaining a structure of an etching apparatus 1 according to a second embodiment of the first invention. Note that those portions in FIG. 10 which are the same as those used in FIG. 1 are referred to by the same reference numerals, and detailed explanation of those portions are omitted herefrom.

Figure 11:
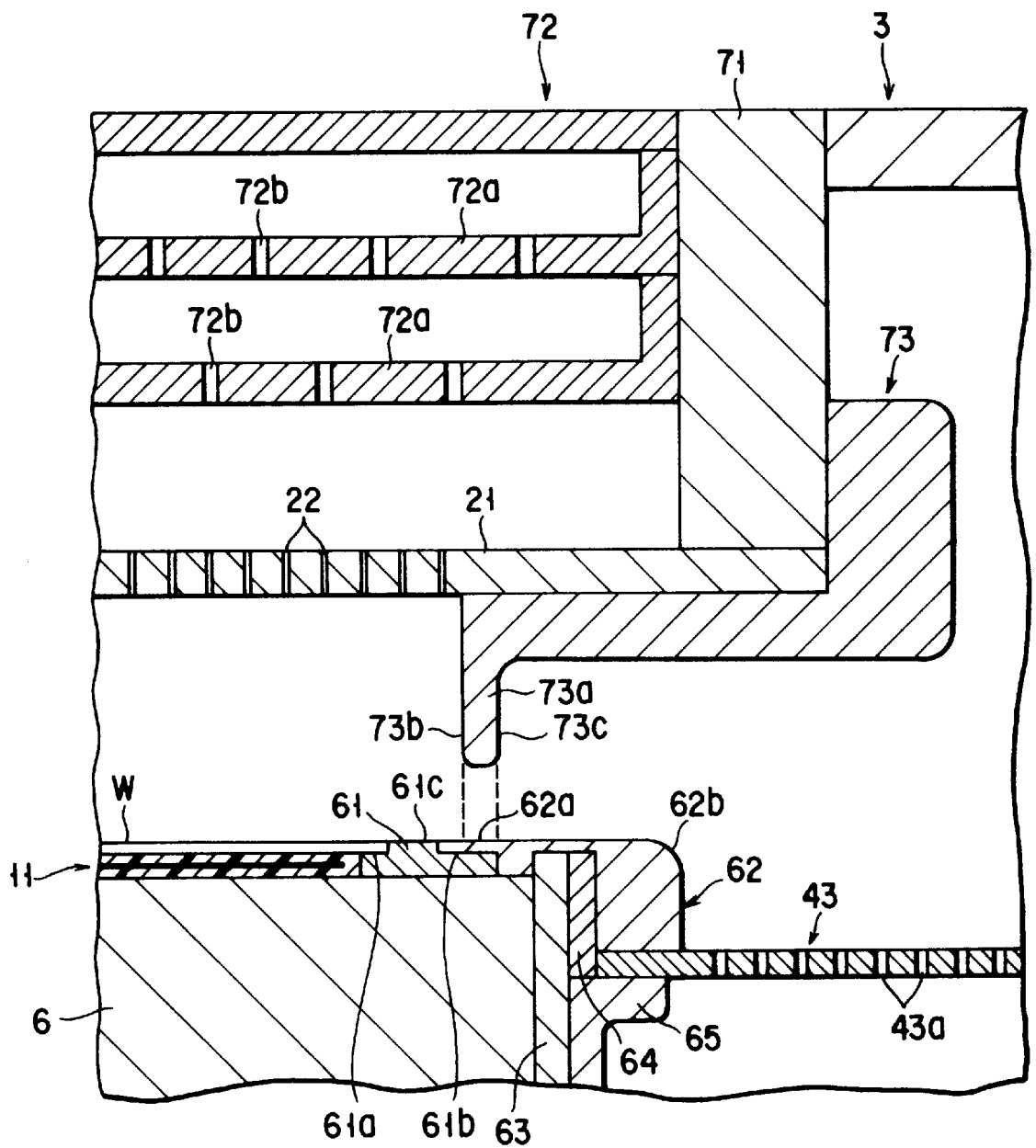
FIG. 11 is an enlarged view of a main part showing a positional relationship between a sealed ring and an outer focus ring in the etching apparatus shown in FIG. 10.

An inner focus ring 61 having a substantially ring-like shape and forming a first ring member is provided so as to surround electrostatic chuck 11 in the periphery on the suscepter 6. This inner focus ring 61 is made of conductive silicon. As shown in FIG. 11, inner and outer circumferences of the upper surface of the inner focus ring 61 are respectively formed as step portions 61a and 61b, and the upper surface of the step portion 61a is arranged to be the same plane of the electrostatic chuck 11. The lower surface of the circumferential edge portion of a wafer W held by the electrostatic chuck 11 is mounted on the upper surface of the step portion 61a. This inner focus ring 61 has a function of making ions in a plasma efficiently be injected into the wafer W.

An outer focus ring 62 having a substantially ring-like shape is provided on the outer circumference of the inner focus ring 61. This outer focus ring 62 is made of insulating quartz. The inner circumferential portion 62a of the outer focus ring 62 is arranged so as to be mounted on the step portion 61b of the inner focus ring 61. Therefore, the outer periphery of the inner focus ring 61 and the inner periphery of the outer focus ring 62 overlap each other at the step portion 61b and the inner circumferential portion 62a. Note that the center portion 61c of the inner focus ring 61 and the upper surface of the outer focus ring 62 are set to form one equal plane. In addition, the outer circumferential upper edge portion 62b of the outer focus ring is formed in a curved shape forming an outward convex such that gases are exhausted without stagnating. This outer focus ring 62 as well as a sealed ring 73 described later have a function of preventing diffusion of a plasma.

As shown in FIG. 11, a baffle plate 43 is formed, with an insulating ring 63 made of quartz and an insulating ring 64 made of fluorine-based resin being interposed. The inner circumferential portion of the baffle plate 43 is fixed to a support member 65 made of quartz, by means of a bolt or the like. Therefore, the baffle plate 43 moves up and down in accordance with upward and downward movements of the suscepter 6. A number of permeable holes 43a are formed in this baffle plate 43, thereby to serve to uniformly exhaust a gas.

A diffusion member 72 for introducing an etching gas and other gases into the processing chamber 2 is provided at an upper portion inside the processing chamber 2, with an insulating member 71 inserted between the member 72 and the processing container 3. This diffusion member 72 has a hollow structure formed by providing a plurality of stages of flat plate portions 72a in the vertical direction in parallel with each other. Further, a number of diffusion holes 72b are formed in each of the flat plate portions 72a. In the center of the diffusion member 72, a gas introduce port 23 is provided, and further, an etching gas from a processing gas supply source 27, e.g., a $CF_4$ gas supplied through valves 24 and 25 and a mass-flow controller 26 for adjusting the flow amount is introduced into the processing chamber 2 through the introduce port 23 and diffusion holes 72b of the diffusion member 72.

Below the diffusion member 72, an upper electrode 21 is supported by an insulating member 71, such that the upper electrode 21 opposes the suscepter 6. The upper electrode 21 is formed of conductive silicon. In addition, the upper electrode 21 has a number of outlet ports 22 for uniformly exhausting a gas introduced by the diffusion member 72 to the wafer W on the suscepter 6. The sealed ring 73 made of quartz forming the upper insulating member is arranged in the periphery of the upper electrode 21 such that the upper inner circumference of the sealed ring 73 is fixed to the insulating member 71.

A ring-like projecting portion 73a is formed on the lower surface near the inner circumference, and the inner circumferential edge 73b of the projecting portion 73a is positioned above a position corresponding to a portion where the outer periphery of the inner focus ring 61 overlaps the inner periphery of the outer focus ring 62, i.e., where the step portion 61b of the inner focus ring 61 overlaps the inner periphery 62a of the outer focus ring 62. The distance between the lower surface of this projecting portion 73a and the inner circumferential portion 62a of the outer focus ring 62 is set to be shorter than the gap between the upper surface of the suscepter 6, i.e., the gap between the upper surface of the electrostatic chuck 11 and the lower surface of the upper electrode 21. Note that each of corner portions of the sealed ring 73 is formed in a shape curved to form a convex toward the outside, so that a gas is smoothly exhausted without stagnating.

The main part of the etching apparatus 1 according to Embodiment 2 is constructed as described above.

In the next, a processing method or the like when etching processing is performed on an oxide ($SiO_2$) film of a silicon wafer W will be explained. Note that the steps of the method are carried out in accordance with a predetermined program.

At first, after the gate valve 51 is opened, a wafer W is conveyed into the processing chamber 2 by the conveyer means 53. In this state, the suscepter 6 is moved down by operation of a drive motor 8 and is kept in a stand-by state for receiving a wafer W. Then, the wafer W is mounted on an electrostatic chuck 11 by the conveyer means 53, and thereafter, the conveyer means 53 is kept aside, and the gate valve 51 is closed. In addition, the suscepter 6 is moved up to a predetermined position by operation of the drive motor 8. Subsequently, the internal pressure of the processing chamber 2 is reduced by a vacuum suction means 41, to a predetermined pressure value. Thereafter, a $CF_4$ gas is supplied from a processing gas supply source 27, and the pressure of the processing chamber 2 is set to and maintained at 10 mTorr, for example.

Thereafter, the upper electrode 21 is supplied with a high frequency power of frequency 27.12 MHz from the high frequency power source 47, and then, a plasma is generated between the upper electrode 21 and the suscepter 6. With a slight delay (about 1 second or less) from the generation of a plasma, the suscepter 6 is supplied with a high frequency power of frequency 800 kHz from the high frequency power source 44. Thus, by supplying a high frequency power for the suscepter 6 at a delayed timing, a wafer W is prevented from being damaged by an excessive voltage.

The $CF_4$ gas in the processing chamber 2 is dissociated by the generated plasma, thereby creating radial atoms of fluorine. The radical atoms of fluorine etch the silicon oxide ($SiO_2$) film on the surface of the wafer W, with their incident speed being controlled by a bias voltage (800 kHz) supplied to the suscepter 6.

In this case, the suscepter 6 is provided with an outer focus ring 62 on the outer circumference of the inner focus ring 61 arranged so as to surround the wafer W, and a projecting portion 73a of the sealed ring 73 provided in the periphery of the upper electrode 21 is positioned above the outer focus ring 62. The outer focus ring 62 and the projecting portion 73a together constitute a gap shorter than the distance between the upper surface of the electrostatic chuck 11 and the lower surface of the upper electrode 21, and therefore, diffusion of a plasma generated between the suscepter 6 and the upper electrode 21 is restricted so that the density of a plasma is increased. Even when the internal pressure of the processing chamber 2 is a high degree of vacuum of 10 mTorr, diffusion of the plasma can be efficiently restricted. Therefore, it is possible to respond to demands for etching processing for a semiconductor device of a highly integrated 64M DRAM, and to obtain a high etching rate. Further since an inner focus ring 61 is provided around the wafer W, radical ions of fluorine as etchant ions are efficiently injected into the wafer W, and the etching rate of the silicon oxide film ($SiO_2$) on the surface of the wafer W is increased much more. For example, the selection ratio of a silicon oxide film in an etching apparatus having the structure described above is improved by 20–30% in comparison with a conventional etching apparatus. The aspect ratio can be improved to about 50%.

In the vicinity of the inner circumference of the projecting portion 73a which serves to enclose a plasma, the plasma density tends to be higher. However, the inner circumferential edge 73b of the projecting portion 73a is positioned at a position corresponding to a portion where the outer periphery of the inner focus ring 61 overlaps the inner periphery of the outer focus ring 62, i.e., above the portion where the step portion 61b of the inner focus ring 61 overlaps the inner circumferential portion 62a of the outer focus ring 62. This overlapping portion is constituted in a structure in which an outer focus ring 62 as an insulating member is thinly layered on an inner focus ring 61 as a conductive member. Therefore, the conditions allow the bias to be more or less suppressed, so that the plasma in the overlapping portion is originally diluted more than in the center portion of the wafer W. Accordingly, the plasma density in the vicinity of the inner circumference of the projecting portion 73a is maintained at a density which is not substantially different from that in the center portion of the wafer, and as a result, the plasma density in the peripheral portion of the wafer W is not substantially different from that in the center portion. Therefore, uniformity in etching of the wafer W is excellent.

A $CF_4$ gas used for etching is exhausted to the outside of the processing chamber 2 through an exhaust pipe 42 thorough the baffle plate 43 from between the sealed ring 73 and the outer focus ring 62. In order to restrict diffusion of a plasma, a projecting portion 73a is formed on the lower surface of the sealed ring 73 and thereby narrows the flow path. Therefore, the gas conductance is consequently lowered. However, the outer circumferential edge 73c of the projecting portion 73a is positioned considerably inward in relation to the outer circumferential edge of the outer focus ring 62, and the thickness of the projecting portion 73a is arranged to be extremely thin. Therefore, finally, the gas conductance between the sealed ring 73 and the outer focus ring 62 is not substantially lowered, so that smooth exhaustion of a gas is realized. Therefore, the flow amount of the etching gas need not be particularly increased, in comparison with this kind of etching apparatus.

In the next, the relationship between the length of the projecting portion 73a and the etching rate will be explained on the basis of data obtained when etching was actually carried out by the present inventors with use of the etching apparatus 1. As shown in FIG. 12, the gap $G_2$ between the upper surface of the wafer W and the lower surface of the upper electrode 21 was set to 15 mm, and an wafer W of 8 inches was etched while changing the minimum gap between the upper surface of the outer focus ring 62 and the lower surface of the projecting portion 73a. The results of this etching are shown in Table 3 below. Note that the conditions of this etching were as follows. The high frequency power of 2 kW with a frequency 27.12 MHz was supplied to the upper electrode 21, the high frequency power supplied to the suscepter 6 was of a frequency 800 kHz and had a Vpp (plasma voltage) of 1.5 kW, and an etching gas of $C_4F_8/CO/Ar/O_2=15/15/2$ was made flow at a flow rate of 55/6 (SCCM).

TABLE 3

| G2 | 15 | 15 | 15 |
|---|---|---|---|
| MG2 | 10 | 8 | 6 |
| Etching Rate (Å/min) | 6863 | 7336 | 7478 |

As can be seen from Table 3, the etching rate is high as the minimum gap $MG_2$ becomes small. However, it has been found that the uniformity of etching is greatly reduced if the minimum gap $MG_2$ is smaller than 6 mm. Therefore, taking into consideration the uniformity of etching, a preferable range of the minimum gap $MG_2$ is 6 to 10 mm, and 8 mm is particularly preferable.

In the next, the relationship between the projecting portion 73a and the gas conductance will be explained. The conductances were 468 (1/s) at $D_2=10$ mm and 625 (1/s) at $D_2=3$ mm, when the gap $G_2$ between the upper surface of a wafer W and the lower surface of the upper electrode 21 was set 25 mm, the minimum gap $MG_2$ was set to 8 mm, $L_2$ was set to 25 mm, and the internal pressure of the processing chamber 2 was set to 45 mTorr where the thickness of the projecting portion 73a is $D_2$ and the length between the inner circumference of the projecting portion 73a and the outer circumference of the outer focus ring 62 is $L_2$, as shown in FIG. 12. If the narrow gap for enclosing a plasma is formed by an insulating member having a flat lower surface as disclosed in Japanese Patent Application KOKAI Publication No. 62-69620 in place of using a projecting portion 73a as in this embodiment, the gas conductance is 312 where the length of the gap in the radial direction (equivalent to $D_2$) is 25 mm. Hence, it has been found that a more excellent conductance can be obtained if a projecting portion 73a which provides a short $D_2$ is formed on a sealed ring 73 and the plasma is enclosed by this projecting portion 73a, in case of restricting diffusion of a plasma.

The projecting portion 73a of the sealed ring 73 in this embodiment is shaped such that the inner and outer sides thereof vertically extend. Otherwise, in place of this projecting portion 73a, a sealed ring 75 having a projecting portion 74 shaped as shown in FIG. 13, for example, may be used. The inner circumference of this projecting portion 74 is shaped so as to vertically extend, while the outer circumference thereof is shaped in a tapered form. With use of this sealed ring 75, gases less stagnate and less reaction products tend to stick than with use of a sealed ring 73.

Further, as for the outer sealed ring, the outer circumference need not be shaped vertically as in the embodiment described above, but it is possible to use an outer sealed ring 76 shaped in a tapered form, as shown in FIG. 13. In this case, the angle to the baffle plate 43 is an obtuse angle greater than in the embodiment described above, less gases tend to stagnate and less reaction products tend to stick. Therefore, with use of the sealed ring 75 and the outer sealed ring 76 as shown in FIG. 13, it is possible to prevent pollution inside the processing chamber 2.

Note that in Embodiment 2, explanation has been made to an apparatus which carries out processing of etching a silicon oxide film ($SiO_2$) on the surface of a semiconductor wafer. However, Embodiment 2 is not limited hitherto but is applicable to an apparatus for performing processing for etching various insulating films such as a silicon nitride (SiN) film, a TEOS oxide film, a BPSG film, and the like. Further, Embodiment 2 is applicable to other plasma processing apparatuses such as a plasma CVD apparatus for performing film formation processing, a spattering apparatus and the likes.

According to Embodiment 2, diffusion of a plasma generated can be prevented without unreasonably increasing the plasma density in the peripheral portion of a substrate to be processed, to be much higher than the center portion of the substrate. Therefore, it is possible to perform fine and uniform etching on the substrate to be processed, at a high etching rate under a high plasma density.

In particular, since the inner circumferential edge and the outer circumferential edge of a portion forming the narrowest distance in the upper insulating member are arranged at positions corresponding to the range defined between the inner circumferential edge and the outer circumferential edge of a second ring-like member, the conductance is excellent while preventing diffusion of a plasma, and the plasma can be efficiently enclosed without restricting the flow amount of a processing gas such as an etching gas or the like.

In addition, the outer peripheral portion of the first ring-like member and the inner peripheral portion of the second ring-like member are overlapped on each other so that the outer circumferential edge of the portion of the upper insulating member forming the narrowest distance is arranged so as to correspond to a position between the inner circumference and outer circumference of the second ring-like member. Therefore, it is possible to prevent diffusion of a plasma at a place much closer to the substrate to be processed, so that etching can be performed on a substrate to be processed under a higher plasma density.

Embodiment 3

Figure 14:
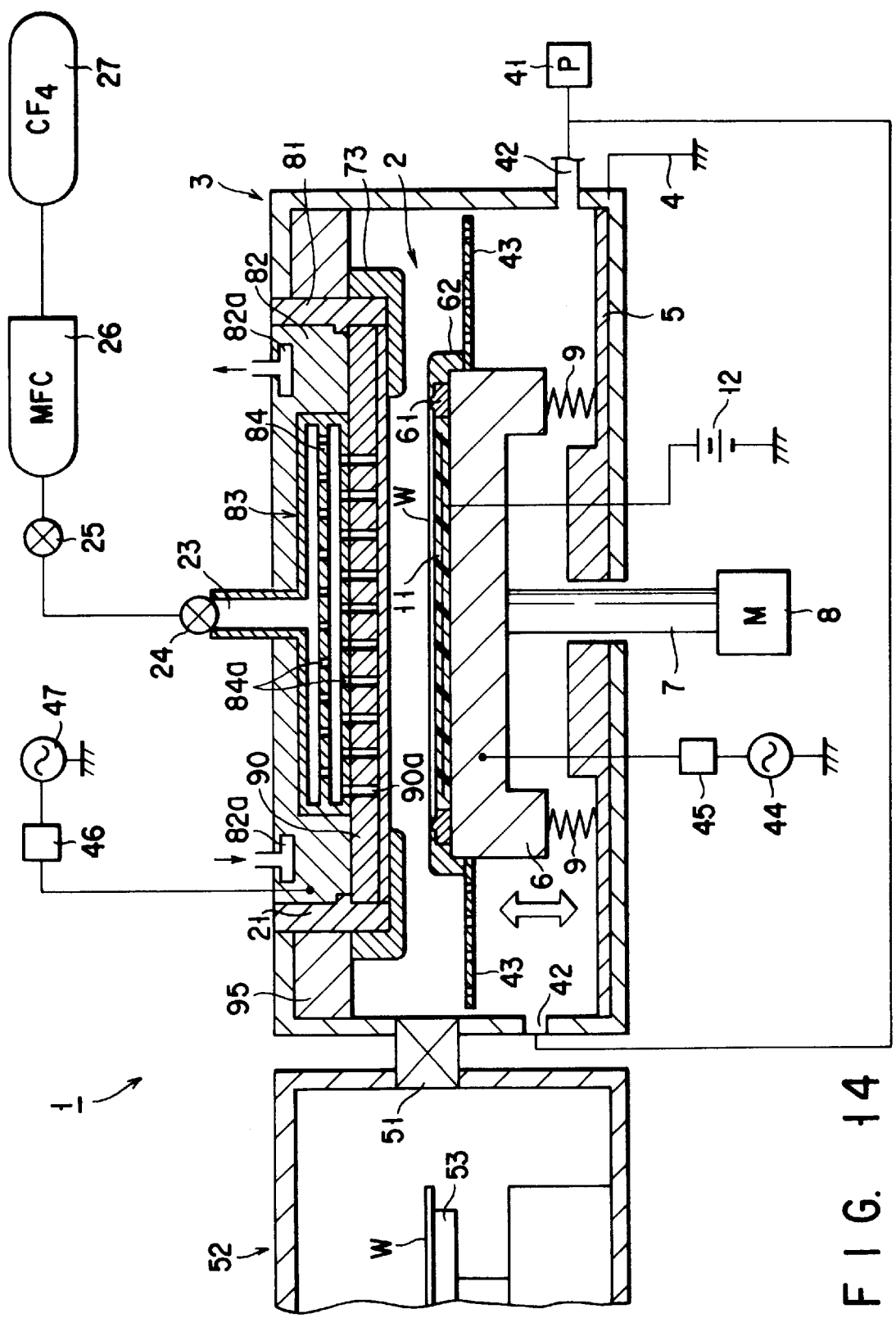
FIG. 14 is a view explaining a structure of an etching apparatus according to the second invention of the present invention.

FIG. 14 is a view explaining the structure of an etching apparatus 1 according to the second invention. Note that those portions of FIG. 14 which are the same as those shown in FIG. 1 are referred to by the same reference numerals, and detailed explanation thereof will be explained herefrom.

An inner focus ring 61 having a substantially ring-like shape is provided on the periphery of the suscepter 6, such that the ring 61 surrounds the electrostatic chuck 11. This inner focus ring 61 is made of conductive mono-crystal silicon. Inner and outer circumferences of the upper surface of the inner focus ring 61 are respectively formed as step portions 61a and 61b, and the upper surface of the step portion 61a is arranged to be the same plane of the electrostatic chuck 11. The lower surface of the circumferential edge portion of a wafer W held by the electrostatic chuck 11 is mounted on the upper surface of the step portion 61a. This inner focus ring 61 has a function of improving the uniformity of the etching rate at the periphery of the wafer W (e.g., portions close to the end of the wafer).

An outer focus ring 62 having a substantially ring-like shape is provided on the outer circumference of the inner focus ring 61. This outer focus ring 62 is made of insulating quartz. The inner circumferential portion 62a of the outer focus ring 62 is arranged so as to be mounted on the step portion 61b of the inner focus ring 61. Therefore, the outer periphery of the inner focus ring 61 and the inner periphery of the outer focus ring 62 overlap each other at the step portion 61b and the inner circumferential portion 62a. The outer circumferential upper edge portion 62b of the outer focus ring is formed in a curved shape forming an outward convex such that gases are exhausted without stagnating. This outer focus ring 62 as well as a sealed ring 73 described later have a function of preventing diffusion of a plasma.

As shown in FIG. 15, a baffle plate 43 made of conductive material (such as aluminum alumite) is provided around the susceptor, with an insulating ring 63 made of quartz and an insulating ring 64 made of fluorine-based resin being interposed therebetween. The inner circumferential portion of the baffle plate 43 is fixed to a support member 65 made of quartz, by means of a bolt or the like. Therefore, the baffle plate 43 moves up and down in accordance with upward and downward movements of the susceptor 6. A number of permeable holes 43a are formed in this baffle plate 43, thereby to serve to uniformly exhaust a gas.

A diffusion member 83 for introducing an etching gas and other gases into the processing chamber 2 is provided at an upper portion inside the processing chamber 2, with an insulating support member 81 made of alumina and a ring-like cooling plate 82 made of aluminum inserted. A coolant circulation path 82a is formed at an upper portion of the cooling plate 82, and has a function of cooling the upper electrode 21 described later to a predetermined temperature, as the coolant supplied from outside is circulated.

The diffusion member 83 has a hollow structure in which baffle plates 84 are provided in form of a plurality of stages at predetermined intervals, as shown in FIG. 15, and further, a number of diffusion holes 84a are formed in the baffle plates 84. In the center of the diffusion member 83, a gas introduce tube 23 is provided, and an etching gas supplied from a processing gas supply source 27 through a mass-flow controller 26, e.g., a $CF_4$ gas is introduced into the processing chamber 2 through the introduce tube 23 and diffusion holes 84a of the baffle plates 84 of the diffusion member 83.

Below the diffusion member 83, a cooling plate 90 made of aluminum is provided, and the upper electrode 21 is supported by the cooling plate 82 such that the lower surface side of the plate 90 opposes the susceptor 6. The upper electrode 21 is made of conductive mono-crystal silicon, and is fixed to the cooling plates 90 and 82 by a bolt 92 thereby being electrically conductive. In addition, the upper electrode 21 and the cooling plate 90 each have a number of outlet ports 90a and 91a in order to exhaust a gas introduced by the diffusion member 83, onto the wafer W on the susceptor 6.

In the peripheral portion of the lower end of the upper electrode 21, a sealed ring 93 made of quartz is provided such that the sealed ring 93 covers the bolt 92. This sealed ring 93 consists of a ring-like horizontal portion 93a and a vertical portion 93b at right angles to the horizontal portion 93a. This vertical portion 93b is installed on the insulating support member 81, for example, fixed thereto by a bolt or the like. A conductive member 94 which has a shape substantially similar to the sealed ring 93 and consists of a horizontal portion 94a formed of a thin plate made of aluminum and a vertical portion 94b are air-tightly embedded in the sealed ring 93. Note that an insulating ring made of fluorine-based synthetic resin is provided between the upper end portion of the sealed ring 93 and the ceiling wall of the processing chamber 3. In addition, in this structure, the power from the high frequency power source 47 is supplied through a cooling plate 82.

The main part of the etching apparatus 1 according to Embodiment 3 is constructed as described above.

In the next, a processing method or the like when etching processing is performed on an oxide ($SiO_2$) film of a silicon wafer W will be explained. Note that the steps of the method are carried out in accordance with a predetermined program.

At first, after the gate valve 51 is opened, a wafer W is conveyed into the processing chamber 2 by the conveyer means 53. In this state, the susceptor 6 is moved down by operation of a drive motor 8 and is kept in a stand-by state for receiving a wafer W. Then, the wafer W is mounted on an electrostatic chuck 11 by the conveyer means 53, and thereafter, the conveyer means 53 is kept aside, and the gate valve 51 is closed. In addition, the susceptor 6 is moved up to a predetermined position by operation of the drive motor 8. Subsequently, the internal pressure of the processing chamber 2 is reduced by a vacuum suction means 41, to a predetermined pressure value. Thereafter, a $CF_4$ gas is supplied from a processing gas supply source 27, and the pressure of the processing chamber 2 is set to and maintained at 10 mTorr, for example.

Thereafter, the upper electrode 21 is supplied with a high frequency power of frequency 27.12 MHz from the high frequency power source 47, and then, a plasma is generated between the upper electrode 21 and the susceptor 6. With a slight delay (about 1 second or less) from the generation of a plasma, the susceptor 6 is supplied with a high frequency power of frequency 800 kHz from the high frequency power source 44. Thus, by supplying a high frequency power for the susceptor 6 at a delayed timing, a wafer W is prevented from being damaged by an excessive voltage.

The $CF_4$ gas in the processing chamber 2 is dissociated by the generated plasma, thereby creating radial atoms of fluorine. The radical atoms of fluorine etch the silicon oxide ($SiO_2$) film on the surface of the wafer W, with their incident speed being controlled by a bias voltage (800 kHz) supplied to the susceptor 6.

In this case, the susceptor 6 is provided with an outer focus ring 62 on the outer circumference of the inner focus ring 61 arranged so as to surround the wafer W, and the sealed ring 93 provided in the periphery of the upper electrode 41 is positioned above the outer focus ring 62. The outer focus ring 62 and the sealed ring 93 together constitute a gap shorter than the distance between the upper surface of the electrostatic chuck 11 and the upper electrode 21, and therefore, diffusion of a plasma generated between the susceptor 6 and the upper electrode 21 is restricted so that the density of a plasma is increased. Even when the internal pressure of the processing chamber 2 is a high degree of vacuum of 10 mTorr, diffusion of the plasma can be efficiently restricted. Since an inner focus ring 61 is provided around the wafer W, radical ions of fluorine are efficiently injected into the wafer W, and the etching rate of the silicon oxide film ($SiO_2$) on the surface of the wafer W is increased much more.

When such etching processing is performed, for example, carbon-based substances are generated in the processing chamber 2, as reaction products generated when etching is performed with use of $CF_4$, $CHF_3$, and the likes. Those carbon-based substances particularly tend to easily stick to the surface of the outermost portion of the sealed ring 93. However, in the present embodiment, since a conductive member 94 is provided inside the sealed ring 93 as has been described above, those reaction produces are prevented from sticking thereto. More specifically, the part of the lower surface of the sealed ring 93 (the part indicated by $L_3$ in FIG. 15) which corresponds to the portion overlapping the upper electrode 21 has a high temperature due to injection of ions. As a result of this, reaction products are difficult to stick to the part indicated as $L_3$ in FIG. 15.

The heat generated is transferred to a transmit member 94 provided in the sealed ring 93. Since the transfer member 94 itself has an excellent heat conductivity, not only the portion corresponding to the portion indicated as $L_3$ but also the entire portion has a high temperature (or is brought into a soaking condition). As a result of this, the portion of the sealed ring 93 adjacent to the transmit member 94 is heated by the heat. Specifically, not only the portion indicated as $L_3$ in FIG. 15 but also the entire of the lower surface of the horizontal portion 93a and the outer surface of the vertical portion 93b have a high temperature. Therefore, the area of the sealed ring 93 to which reaction products tend to easily stick has a high temperature, and sticking of reaction products is restricted. In addition, the transmit member 94 thus functioning is embedded air-tightly in the sealed ring 93, and therefore, the transmit member 94 itself is not directly exposed to a plasma so that the member 94 does not pollute the inside of the processing chamber 2.

In view of the function of the transmit member 94, the heat collected by the transmit member 94 must be transmitted as much as possible to the lower surface and the outer surface of the sealed ring 93, and therefore, the transmit member 94 is embedded to be adjacent to the lower and outer surfaces of the sealed ring 93. In this respect, in order to transmit the heat to the lower and outer surfaces of the sealed ring 93 more efficiently, it is preferable to adopt the structure shown in FIG. 16. Note that those members of FIG. 16 which are referred to by the same reference numerals as used in FIGS. 14 and 15 are the same members as those used in FIGS. 14 and 15.

Specifically, the structure shown in FIG. 16 is arranged such that a vacuum layer 96 is formed on the back surface of the transmit member 94, i.e., the side opposite to the lower surface of the sealed ring 93 as a surface opposite to the suscepter 6. In this structure, the heat collected by the transmit member 94 is prevented from being transmitted to the upper surface and inner side of the sealed ring 93, by the vacuum layer 96. Accordingly, the heat is more efficiently transmitted to the lower and outer surfaces of the sealed ring 93. In addition, by subjecting the back surface 96a of the vacuum layer 96 to reflection processing such as mirror processing, the heat collected by the transmit member 94 is prevented from being radiated to the upper surface and inner side, and accordingly, the efficiency of heat transmittance to the lower and outer surfaces of the sealed ring 93 can be much more improved.

In the embodiment described above, only the internal portion of the sealed ring 93 positioned in the periphery of the upper electrode 21 is constructed in a structure in which the transmit member 94 is embedded. However, as shown in FIG. 17, a transmit member 97 similar to the transmit member 94 may be air-tightly embedded to be close to the upper surface and the outer side of the outer focus ring 62, inside the outer focus ring 62 opposing the sealed ring 93 and positioned in the periphery of the suscepter 6. In this structure, the heat of the area indicated as M3 in FIG. 17 where ions are injected and the temperature is made high is collected by the transmit member 97 and is transmitted to the upper and outer surfaces of the outer focus ring 62. As a result of this, the temperature of the upper and outer surfaces of the outer focus ring 62 are made high, thereby preventing reaction products from sticking thereto. Of course, in this case, a vacuum layer may be formed on the back surface of the transmit member 97 or the back surface of the vacuum layer may further be subjected to reflection processing, thereby to improve the heat transmit efficiency, like in the case of FIG. 16.

Note that, in the above embodiment, explanation has been made to an apparatus which carries out processing for etching a silicon oxide film ($SiO_2$) on the surface of a semiconductor wafer. However, Embodiment 2 is not limited hitherto but is applicable to an apparatus for performing processing for etching various insulating films such as a silicon nitride (SiN) film, a TEOS oxide film, a BPSG film, and the like. Further, the substrate to be processed is not limited to a wafer, but may be an LCD substrate. In the above embodiment, although explanation relating to the structure of the apparatus has been made to an etching apparatus, Embodiment 3 is not limited hitherto, but is applicable to other plasma processing apparatuses such as a plasma CVD apparatus for performing film formation processing, a spattering apparatus and the likes.

According to Embodiment 3, the temperature of the surface of the insulating member corresponding to an area in an insulating member where a transmit member is embedded can be made high, without optionally providing a heater. Therefore, reaction products tend to less stick to the surface of this area, and the reaction products which have been sticking thereto are removed. In addition, the inside of the processing chamber is not polluted. Further, there is no possibility that the plasma in the processing chamber may be disturbed. In particular, by providing a vacuum layer, the temperature of the surface of an insulating member (i.e., the side exposed to an internal atmosphere of the processing chamber) to which reaction products easily stick can be efficiently increased.

Embodiment 4

In a conventional plasma processing apparatus, an insulating member provided in the periphery of an upper electrode and a lower electrode to enclose a plasma is normally made of quartz, and the quartz is sputtered by a plasma if the insulating is exposed to the plasma. The quartz thus sputtered forms a mist in the processing chamber, and the mist sticks to the surface and the likes of the substrate to be processed, thereby involving a problem that the yield of the substrate to be processed is degraded.

Further, as the sputtering of the insulation member proceeds, projections and recesses are formed on the surface of the insulation member, thereby deteriorating the precision of the horizontal degree. As a result, an abnormal discharge occurs, distributing the plasma state. At the same time, concave and convex portions are formed in the surface of the insulating member, so that the accuracy of the levelness is degraded. As a result of this, the plasma condition, i.e., the degree of parallelization of the plasma varies in relation to the substrate to be processed. Therefore, a problem occurs in that stable plasma processing cannot be performed. In addition, if the insulating member is thus sputtered by a plasma, there is another problem that the life time of the insulating member is shortened and the number of times as well as the time length for which the insulating member must be replaced are increased, thereby reducing the operation time of the apparatus.

According to this embodiment, there is provided a plasma processing apparatus in which stable processing can be performed by restricting sputtering of an insulating member. Specifically, there is provided a plasma processing apparatus in which a substrate to be processed is provided in a processing container and a plasma is induced in the processing container, wherein a member made of quartz is provided in the processing container and an insulating film having a higher sputtering resistance against a plasma than quartz is provided on the surface of the member. In this case, the insulating film is preferably made of alumina-based ceramics and the insulating film is preferably provided on the surface of quartz by detonation flame spraying.

Also according to this embodiment, an insulating member which encloses a plasma in a predetermined space in a processing container and which is constituted by quartz arranged in the processing container so as to induce a plasma of a high density is protected from erosion. In addition, by providing an insulating film on the surface of the insulating member by explosive elution, the insulating member and the material forming the insulating film are securely joined together, so that the erosion resistance against the plasma is improved.

Figure 18:
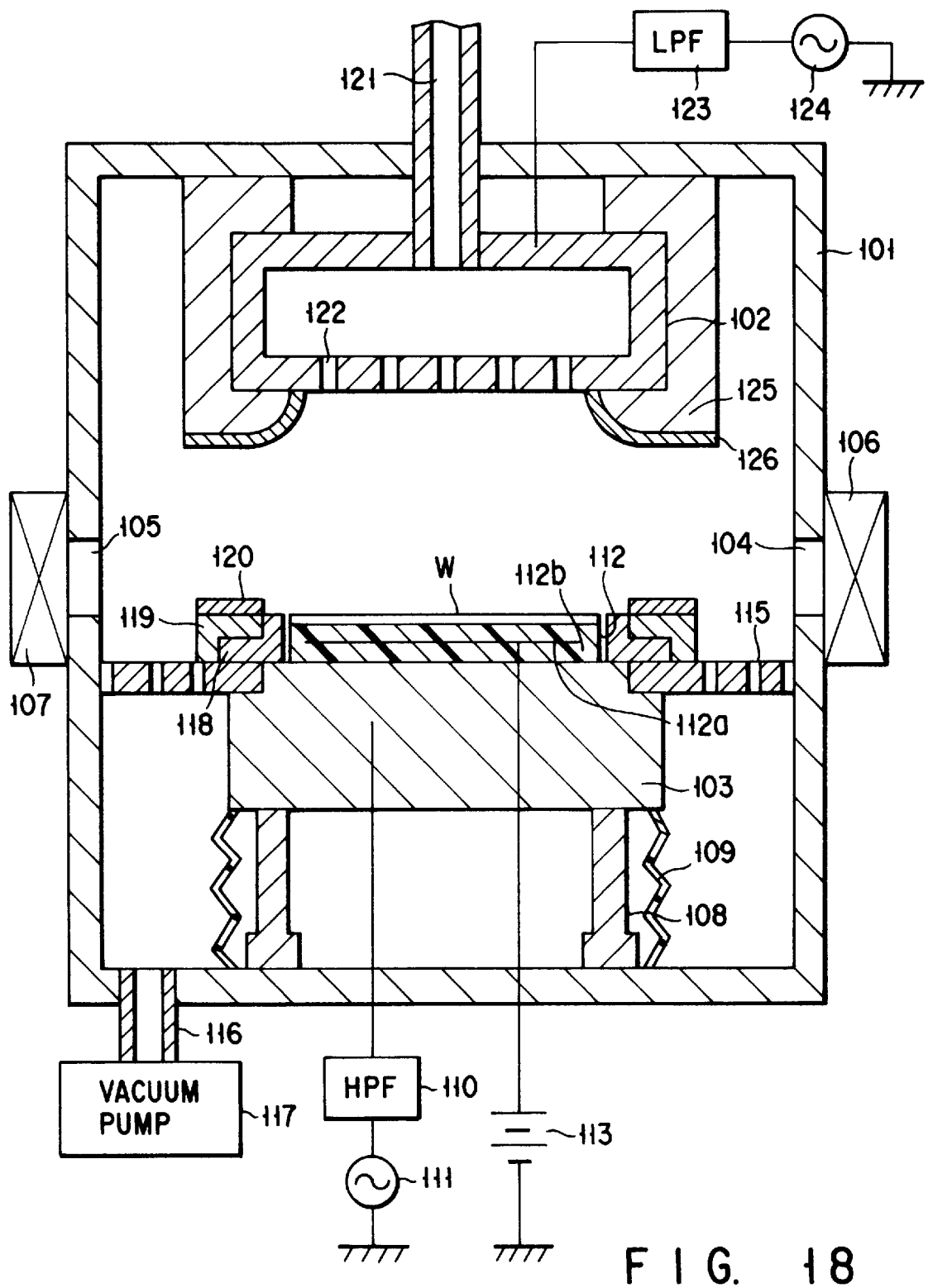
FIG. 18 is a view explaining a structure of an etching apparatus according to Embodiment 4 of the present invention.

FIG. 18 is a view explaining the structure of an etching apparatus according to Embodiment 4. This etching apparatus according to Embodiment 4. This etching apparatus is mainly comprised of a chamber (processing chamber) 101 made of aluminum and shaped in a cylindrical form, and an upper electrode (or first electrode) 102 and a lower electrode (or second electrode) 103 provided in the chamber 101 to be opposite to each other.

Opening portions 104 and 105 for conveying in and out a substrate such as a wafer W to be processed are formed in the side wall portion of the chamber 101, and gate valves 106 and 107 are provided outside the opening portions 104 and 105, thereby to open and close the opening portions 104 and 105 to enable air-tightness of the chamber 101.

A lower electrode 103 is provided at a lower portion in the chamber 101, and the lower electrodes installed on an elevation device 108 for elevating up and down the lower electrode 103. This elevation device 108 is constituted by a combination of a screw coupling mechanism coating of, for example a hydraulic cylinder or a ball screw and a nut, and a servo motor for rotating and driving the coupling mechanism. Bellows 109 for covering the outer circumference of the elevation device 108 is provided between the elevation device 108 and the inner wall of the chamber 101, so that a plasma generated in the chamber 101 might not enter into the under side of the lower electrode 103.

The lower electrode 103 is connected to a high-pass filter 110 for preventing entering of a high frequency component applied to the upper electrode 102. The high-pass filter 110 is connected to a high frequency power source 111 for supplying a voltage having, for example, a frequency of 800 KHz. In addition, an electrostatic chuck for temporarily fixing a wafer W is provided on the upper surface of this lower electrode 103. This electrostatic chuck 112 has a sheet-like conductive electrode plate 112a and polyimide layers 112b for clamping the surfaces of the electrode plate 112a. This electrode plate 112a is electrically connected to a direct current power source 113 for generating a coulomb force for temporarily holding the wafer W.

A ring-like baffle plate 114 is provided between the lower electrode 103 and the inner wall surface of the chamber 101. This baffle plate 114 is provided with a number of exhaust ports 115 for uniformly exhausting a gas from the circumference of the lower electrode 103. Below these exhaust ports, an exhaust tube 116 is provided for exhausting a processing gas from inside the chamber 101, and this exhaust tube 116 is connected to a vacuum pump 117.

Around the wafer W on the lower electrode 103, there is provided a ring-like focus ring 118 made of silicon carbide (SiC) for uniformly forming a plasma over the wafer to the circumferential edge portion thereof, by spreading a plasma in an outward direction of the wafer W. A focus ring 119 is assembled to be engaged on the outer circumference of the focus ring 118 made of silicon carbide, and the focus ring 119 serves to enclose the plasma above the wafer W to increase the plasma density. An alumina-based ceramics layer 120 which is a member having a higher plasma resistance than quartz is provided on the upper surface of this focus ring 119, in order to ensure erosion by a plasma.

Meanwhile, an upper electrode 102 having a hollow structure and opposing the lower electrode 103 is provided at an upper portion in the chamber 101. This upper electrode 102 is connected with a gas supply tube 121 for supplying the chamber 101 with a predetermined processing gas. A number of gas diffusion holes 122 are provided in the lower portion of the upper electrode 102. In addition, the upper electrode 102 is connected to a low-pass filter 123 for preventing entering of a high frequency component applied to the lower electrode 103. This low pass filter 123 is connected to a high frequency power source 124. This high frequency power source 124 supplies a power having a higher frequency of, for example, 27.12 MHz than the frequency of the high frequency power source 111 connected to the lower electrode 103.

Around the upper electrode 102, a ring-like sealed ring 125 made of quartz is provided and serves to enclose a plasma above the wafer W. This sealed ring 25 is engaged on the outer circumferential portion of the upper electrode 102. An alumina-based ceramics layer 126 having an erosion resistance higher than quartz is provided on the side of the sealed ring 125 which is in contact with a plasma. Alumina-based ceramics layers 120 and 126 provided on the sealed ring 125 made of quartz and the focus ring 119 are formed by explosive elution in order to securely coupled with quartz material.

The detonation flame spraying will now be explained. The explosive elution uses a barrel 127 of a hollow structure, as shown in FIG. 19A. This barrel is supplied with a gas having a high combustibility, e.g., an acetylene gas and an oxygen gas, and simultaneously, is supplied with powder material of alumina-based ceramics. Inside this barrel 127, a mixture gas consisting of an acetylene gas and an oxygen gas is exploded by sparkling a spark plug 128, and a high speed combustion energy generated by the explosion is used to make alumina-based ceramics powder material collide with the sealed ring 125 made of quartz and the focus ring 119. Due to this collision, alumina-based ceramics powder material bites into the surfaces of the sealed ring 125 made of quartz and the focus ring 119, thereby forming a mixture layer 129 of quartz and alumina-based ceramics. Alumina-based ceramics layers 120 and 126 are formed on the surface of the mixture layer 129.

Thus, since alumina-based ceramics layers 120 and 126 are formed on the mixture layer 129 of quartz and alumina-based ceramics, the coupling force between these alumina-based ceramics layers 120 and 126, the sealed ring 125 made of quartz, and the focus ring 119 is improved, so that the erosion resistance of the alumina-based ceramics layers 120 and 126 against a plasma is improved.

When the mixture gas consisting of an acetylene gas and an oxygen gas is exploded, the temperature of this mixture gas rises to 2500° C. or more, e.g., to 3300° C., and this mixture gas burns. The combustion gas of the mixture gas moves toward the muzzle of the barrel at a speed as about ten times fast as the sonic velocity. Due to this combustion gas, the powder material of alumina-based ceramics is half melted, and collides with the surfaces of the sealed ring 125 made of quartz and the focus ring 119, thereby forming rigid alumina-based ceramics layers 120 and 126 on each of the surfaces of the sealed ring 125 made of quartz and the focus ring 119. The alumina-based ceramics layers 120 and 126 each have a thickness of, for example, several tens $\mu$m to several hundreds am.

After the formation of these layers, these alumina-based ceramics layers 120 and 126 are preferably subjected to smoothing processing, by polishing the surfaces of the layers. It is preferable that the thickness of each of the alumina-based ceramics layers 120 and 126 is finally 10 to 400 μm, in view of the erosion resistance against a plasma and that the porosity is 2% or less in order to restrict particles as much as possible. In addition, the purity of alumina in the alumina-based ceramics layers 120 and 126 is preferably 99.5% or more, and the Vickers hardness thereof is preferably 900 or more in view of the erosion resistance against a plasma. In case of polishing the alumina-based ceramics layers 120 and 126, the surface roughness of the surface to be polished is preferably 2 μm or less in view of the difficulty in sticking of secondary products and easiness in removal of sticking substances. In addition, when the alumina-based ceramics layers are formed as a part of an insulating member, the surface of the insulating member is covered with a mask and elution is performed from outside the mask.

In the next, operation of the etching apparatus having the above structure will be explained below, on the basis of FIG. 18. One of gate valves 106 and 107 is previously released, and a wafer W is made pass through the gate valve 106 or 107 from a load lock chamber (not shown) and is then mounted on a lower electrode 103. Thereafter, the gate valve 106 or 107 is closed. Subsequently, a processing gas is supplied through a gas supply tube 121. This gas flows into the upper electrode 102 having a hollow structure, and is diffused uniformly in the processing chamber through gas diffusion holes 122 provided in the lower portion of the upper electrode 102.

In this state, the upper electrode is applied with a high frequency voltage of a frequency 27.12 MHz from a high frequency power source 124. After a predetermined time period, e.g., at a timing of a delay of 1 second or less, the lower electrode 103 is applied with a voltage of a frequency 800 kHz from the high frequency power source 111, thereby generating a plasma between the upper electrode 102 and the lower electrode 103. Due to generation of this plasma, the wafer W is securely drawn and held on the electrostatic chuck 112. This plasma is enclosed between the ring-like sealed ring 125 made of quartz around the upper electrode 102 and the ring-like focus ring 119 made of quartz around the lower electrode 103, and has a high density. In this state, the sealed ring 125 and the focus ring 119 both made of quartz are protected from sputtering due to a high density plasma by means of alumina-based ceramics layers 120 and 126. In addition, the processing gas flows to an exhaust tube 116 through an exhaust port 115 from around the wafer W.

According to this etching apparatus, a plasma is enclosed between the upper electrode 102 and the lower electrode 103 by means of the sealed ring 125 and focus ring 119 both made of quartz, so that a plasma of a high density can be generated and a wafer can be etched at a high etching rate. Further, the sealed ring 125 and the focus ring 119 are respectively provided with alumina-based ceramics layers 120 and 126, so that these sealed ring 125 and focus ring 119 are protected from erosion due to a plasma. As a result of this, the life times of the sealed ring 125 and the focus ring 119 can be extended. Further, since these rings are protected from erosion due to a plasma, particles generated in the chamber 101 are reduced, and the plasma generated in the chamber 101 is stabilized, so that the yield of etching processing for wafers is improved.

In the next, another example of Embodiment 4 will be explained with reference to FIG. 20. Those portions of FIG. 20 which are the same as those used in FIG. 18 are referred to by the same reference numerals, and detailed explanation of those portions will be omitted herefrom.

In this example, as shown in FIG. 20, the chamber 101 of FIG. 18 is provided with a detachable cylinder 130 made of quartz. On the inner circumferential surface of this cylinder 130, an alumina-based ceramics layer 131 is provided. By thus providing a quartz cylinder 130 around the upper electrode 102 and the lower electrode 103, a plasma is more efficiently enclosed between the upper electrode 102 and the lower electrode 103, and it is therefore possible to obtain a plasma having a density much higher than that obtained in the former example. In this state, the cylinder 130 made of quartz is protected from erosion due to a plasma by means of an alumina-based ceramics layer 131. In addition, the cylinder 130 made of quartz serves to prevent those reaction products from sticking to the wall surface inside the chamber 101, which are produced during generation of a plasma and will cause particles. Even when reaction products stick to the cylinder 130 made of quartz, the cylinder 130 can be replaced with new one since this cylinder 130 made of quartz is detachable. Thus, maintenance can be easily performed.

Note that, in the latter example, the etching apparatus has been explained as a plasma processing apparatus. Embodiment 4, however, is not limited to this application, but is applicable to other plasma processing apparatuses such as a plasma CVD apparatus for performing film formation processing, a spattering apparatus and the likes. In the above two examples, the alumina-based ceramics layers are provided for both of the focus ring 119 and the sealed ring 125. However, only one alumina-based ceramics layer may be provided for either one of the rings. Also, in the above two examples, alumina-based ceramics layers are provided on only those portions of the focus ring 119 and the sealed ring 125 that are exposed to a plasma in order to countermeasure a plasma coming round, alumina-based ceramics layers may be additionally provided for the other portions. Further, in the above two examples, both of the upper electrode 102 and the lower electrode 103 are connected with high frequency power sources, in the etching apparatus. Embodiment 4 is not limited hitherto, but is applicable to an apparatus in which either one of the electrodes is connected with a high frequency power source, to obtain the same effects. In addition, it is possible to adopt Embodiment 4 in any apparatus, such as an apparatus using a micro wave without using an electric field for generating a plasma, an apparatus using an inductive method like a TCP (Transformer Coupled Plasma), or the like, and to obtain the same effects, as long as such an apparatus has a structure in which an insulating member exists in a plasma atmosphere.

According to Embodiment 4, direct sputtering of insulating members made of quartz which are provided so as to enclose a plasma in predetermined areas, due to a plasma, is reduced by means of alumina-based ceramics layers. Therefore, the life times of the insulating members are extended, and the number of times of replacements of the insulating members and the time periods required for such replacements are reduced, so that the work time of the apparatus can be improved. Further, sputtering of the insulating members by a plasma can be reduced, so that generation of a mist of quartz which will cause particles in the processing chamber can be restricted, and the plasma condition can be stabilized. As a result, the yield of the plasma processing for a substrate to be processed can be improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus wherein upper and lower electrodes are arranged opposite to each other in a processing chamber whose pressure can be freely reduced, a plasma is generated between the upper and lower electrodes by supplying a high frequency power, and processing is performed on a substrate to be processed which is mounted on the lower electrode, wherein an upper insulating member is provided around the upper electrode, an outer lower end portion of the upper insulating member is positioned outside an outer circumference of the lower electrode, the outer lower end portion of the upper insulating member is positioned to be substantially equal to or lower than an upper surface of the substrate, and the narrowest distance between the upper insulating layer and the lower electrode is smaller than a distance between the upper and lower electrodes.

2. An apparatus according to claim 1, wherein a lower insulating member is provided around the lower electrode, that the outer lower end portion of the upper insulating member is positioned outside the outer circumference of the lower insulating member, the outer lower end portion of the upper insulating member is positioned to be substantially equal to or lower than the upper surface of the substrate, and the narrowest distance between the upper and lower insulating members is smaller than the distance between the upper and lower electrodes.

3. An apparatus according to claim 2, wherein said lower insulating member has an upper outer end surface which is inclined downward.

4. An apparatus according to claim 3 wherein said upper insulating member has a lower outer end surface which is inclined downward.

5. An apparatus according to claim 1, wherein the upper insulating member is provided with a plasma monitor window.

6. An apparatus according to claim 1, wherein the lower surface of the upper insulating member is provided with a notch portion used for monitoring a plasma.

7. An apparatus according to claim 1, wherein the lower surface of the upper insulating member is formed of consecutive surfaces having no gaps.

8. An apparatus according to claim 1, wherein a grounded electrode is provided around the lower electrode.

9. An apparatus according to claim 1, wherein the lower insulating member is a focus ring for increasing the incident efficiency of a plasma into the substrate.

10. A plasma processing apparatus wherein upper and lower electrodes are arranged opposite to each other in a processing chamber whose pressure can be freely reduced, a plasma is generated between the upper and lower electrodes by supplying a high frequency power, and processing is performed on a substrate to be processed which is mounted on the lower electrode, wherein an upper insulating member is provided in the periphery of the upper electrode, a first ring-like member made of semiconductor material and a second ring-like member made of insulating material and positioned on an outer circumference of the first ring-like member are provided in the periphery of the lower electrode, the narrowest distance between an extended portion of the upper instulating member which is downward extended from an inner circumference thereof and the second ring-like member is smaller than a distance between the upper and lower electrodes, and the inner circumferential edge of the upper insulating member is arranged so as to correspond to a position between inner and outer circumferential edges of the second ring-like member.

11. An apparatus according to claim 10, wherein the first and second ring-like members are focus rings for increasing an incident efficiency of a plasma into the substrate.

12. An apparatus according to claim 10, wherein said first and ring-like members are partially overlapped with each other to form an overlapped area, and said extended portion has a lower face facing the overlapped area.

13. A plasma processing apparatus wherein upper and lower electrodes are arranged opposite to each other in a processing chamber whose pressure can be freely reduced, a plasma is generated between the upper and lower electrodes by supplying a high frequency power, and processing is performed on a substrate to be processed which is mounted on the lower electrode, wherein a conductive member having a high heat conductivity is embedded inside an insulating member positioned at an peripheral portion of at least one of the upper and lower electrodes.

14. An apparatus according to claim 13, wherein said insulating member is positioned at the peripheral portion of the upper electrode and a vacuum layer is formed on an upper side of the conductive member.

15. An apparatus according to claim 13, wherein the conductive member is formed of a kind of material selected from a group of aluminum, poly-crystal silicon, and boron nitride.

* * * * *